(12) United States Patent
Bilas

(10) Patent No.: US 6,711,509 B2
(45) Date of Patent: Mar. 23, 2004

(54) IMPULSIVE TRANSIENT HARDWARE SIMULATION

(75) Inventor: Ronald J. Bilas, Murfreesboro, TN (US)

(73) Assignee: Square D Company, Palatine, IL (US)

( * ) Notice: Subject to any disclaimer, the term of this patent is extended or adjusted under 35 U.S.C. 154(b) by 148 days.

(21) Appl. No.: 09/957,093

(22) Filed: Sep. 20, 2001

(65) Prior Publication Data

US 2002/0193961 A1 Dec. 19, 2002

Related U.S. Application Data

(63) Continuation-in-part of application No. 09/824,414, filed on Apr. 2, 2001.

(51) Int. Cl.[7] .............................................. G06F 19/00
(52) U.S. Cl. ........................... 702/61; 702/61; 702/107; 702/120; 702/126; 703/18; 703/14; 714/740; 708/270; 708/845
(58) Field of Search .............................. 702/57, 80, 85, 702/106, 107, 108, 117, 120, 123, 124, 126, 119; 703/13–22; 714/740; 708/8, 270, 272, 845

(56) References Cited

U.S. PATENT DOCUMENTS

| | | | |
|---|---|---|---|
| 5,650,951 A | * | 7/1997 | Staver ........................ 708/313 |
| 5,748,642 A | * | 5/1998 | Lesmeister ................. 714/724 |
| 6,373,418 B1 | * | 4/2002 | Abbey ........................ 341/143 |

OTHER PUBLICATIONS

"Powerlogic® Advanced Power Reliability Solutions," Square D Schneider Electric, brochure, 2000, 3 pages doublesided.
"Powerlogic® Circuit Monitor—Series 2000," Square D Schneider Electric, brochure, 3 pages doublesided.
"Powerlogic® Power Meter," Square D Schneider Electric, brochure, 1998, 2 pages doublesided.
"Powerlogic® Metering & Monitoring Devices," Square D Schneider Electric, brochure, 2000, 2 pages doublesided.
"Powerlogic® Power Monitoring and Control System," Square D Schneider Electric, brochure, 1998, 4 pages doublesided.
"Powerlogic® Series 4000 Circuit Monitor," Square D Schneider Electric, brochure, 2000, 3 pages doublesided.

* cited by examiner

*Primary Examiner*—Marc S. Hoff
*Assistant Examiner*—Elias Desta
(74) *Attorney, Agent, or Firm*—Michael J. Femal; Larry I. Golden

(57) ABSTRACT

An on-board self test system for an electrical power monitoring device includes a test signal circuit in an electronic circuit of the monitoring device, and responsive to a programmable test input signal for producing an analog signal simulating an electrical power waveform, and a programmable memory in an electronic circuit of the monitoring device and operatively coupled with the test signal circuit for storing and reproducing upon command, one or more of the programmable test input signals.

27 Claims, 17 Drawing Sheets

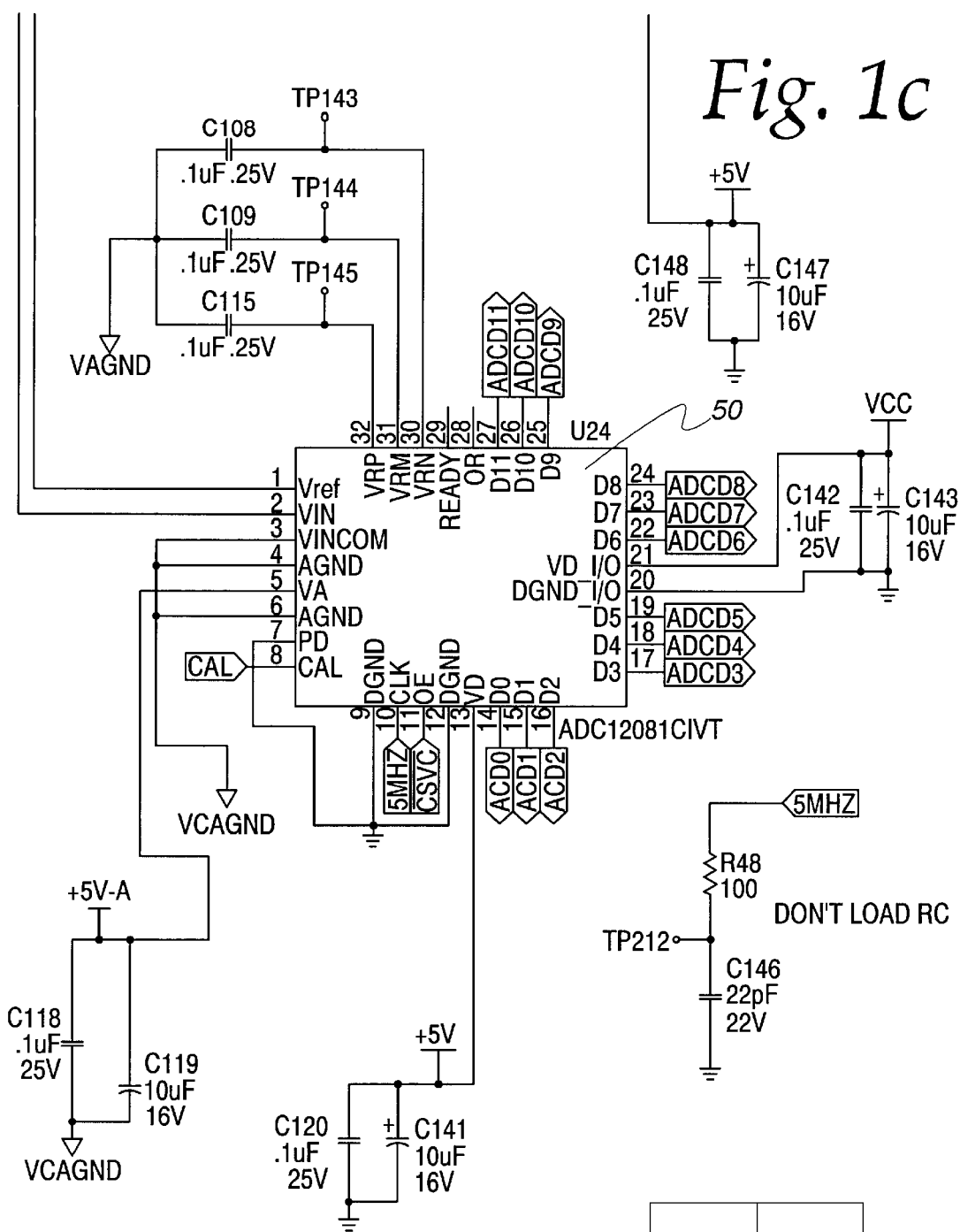

NOTE: REMOVE JTAG 0 ohm RESISTORS
WHEN DEBUGGER ATTACHED

| Fig. 2a | Fig. 2b | Fig. 2c | Fig. 2d |
| --- | --- | --- | --- |
| Fig. 2e | Fig. 2f | Fig. 2g | Fig. 2h |

IMPULSIVE TRANSIENT HARDWARE SIMULATION

CROSS-REFERENCE TO RELATED APPLICATION

This is a continuation-in-part of U.S. patent application Ser. No. 09/824,414, filed Apr. 2, 2001 entitled "Impulsive Transient Detection And Data Acquistion Coprocessor," the disclosure of which is incorporated herein by reference.

FIELD OF THE INVENTION

The present invention relates generally to power monitoring systems and, more particularly, to impulsive transient simulation for use in a power monitoring system.

BACKGROUND OF THE INVENTION

Power monitoring (PMO) systems monitor the flow of electrical power in circuits through a plant or other facility. In the POWERLOGIC system manufactured by the instant assignee, circuit monitors and power meters are dedicated to power monitoring, while other compatible devices collect additional equipment information from protective relays, circuit breakers, transformer temperature controllers, and panelboards. Electrical data, such as current, power, energy, waveforms, and equipment status, is passed over a data network to one or more personal computers. The personal computers run power monitoring application software that retrieves, stores, organizes, and displays real-time circuit information in simple, usable formats. The information collected and stored in a power monitoring system helps operate a facility more efficiently. The quality of the data depends upon the accuracy of the instrumentation and the usability of the display formats.

The power meter can replace conventional metering devices such as ammeters, voltmeters, and watt-hour meters while providing other capabilities not offered by analog metering. The power meter's true rms readings reflect non-linear circuit loading more than conventional analog metering devices. The power meter calculates the neutral current, which can assist in identifying overloaded neutrals due to either unbalanced single phase loads or triplen harmonics. Circuits can be closely monitored for available capacity by keeping track of the peak average demand current.

The power meter can provide a full complement of rms metering values to a metering display and/or via a standard communication port to a power monitoring and control system. The display is connected to the power meter with a communications cable and allows the user to view metering data and access meter setup and reset menus. Because the display can be mounted at a remote location relative to the power meter itself, the power meter can be installed in tight equipment spaces without sacrificing a convenient and affordable metering display.

One type of remote metering display includes a character-based display screen that presents power monitoring data such as voltage, current, power and energy. The display is remote from the power meter but is connected to the power meter via an RS-232 or other communications cable that provides both the power metering data and power to the display. By using several user interface buttons, a user can selectively navigate through defined data screens that present specific data. The remote metering display may be mounted on a front switchgear panel while the power meter itself is mounted within the switchgear. In fact, there may be several displays mounted on the same front switchgear panel.

High voltage transients can degrade power systems. The high data rates required in transient detection are too fast for the microprocessors in current PMO products to handle by themselves and still perform other data sampling and reporting functions at the desired rate. The occurrence of these transients is often intermittent and unpredictable.

A Transient-Current-Voltage (TCV) Module of the type described in copending U.S. patent application Ser. No. 09/824,414, filed Apr. 2, 2001 solves the problem of unattended detection, storage, and analysis of these transients. The Acquire/Trigger/Control/Interface (ATCI) chip is a component of the TCV and makes the TCV possible. When used in a system with a general purpose microprocessor, the ATCI chip makes possible the continuous real-time detection and storage of high voltage transients on any of three independent channels. The "plug-in" nature of the module makes it easy for the customer to upgrade an existing PMO, such as a current-voltage monitor (CVM) with a TCV by simply replacing the module and downloading the main meter firmware.

Square D, the assignee, currently manufactures a CVM, known as a CM4 meter. This invention adds transient analysis capability to an existing CM4 meter in a small, relatively low cost plug-in module and enhances the functionality of the CM4. It allows the customer to add transient analysis to the CM4 by simply purchasing the module and upgrading the CM4 firmware. It provides transient analysis capability to customers at significantly lower cost than competitive offerings. The CM4 can analyze data at a rate of 512 samples/cycle. The TCV can analyze data at a rate of 83,333 samples/cycle. Any customer who wants high speed transient analysis in addition to the present low speed analysis can use the TCV.

All PMO products must be tested before shipment to assure that they are operating. Normally, this is done with external test equipment. Although external test equipment may still be necessary to assure the product work after it is manufactured, this invention enhances the normal manufacturing test and carries testing a step farther. In accordance with the invention, if an unobtrusive signal source is included at the very beginning of the signal path of an analog measurement system, high confidence in the functionality of the entire measurement system can be obtained by injecting test signals using the signal source and verifying the system response.

SUMMARY OF THE INVENTION

Briefly, in accordance with the foregoing, an on-board self test system for an electrical power monitoring device comprises a test signal circuit in an electronic circuit of the monitoring device, and responsive to a programmable test input signal for producing an analog signal simulating an electrical power waveform, and programmable memory in an electronic circuit of the monitoring device and operatively coupled with the test signal circuit for storing and reproducing upon command, one or more of the programmable test input signals.

In accordance with another aspect of the invention, a self test method for an electrical power monitoring device comprises generating a test signal in an electronic circuit of the monitoring device in response to a programmable test input signal, and storing and reproducing upon command in an electronic circuit of the monitoring device one or more of the programmable test input signals.

In accordance with another aspect of the invention, a self test system for an electrical power monitoring device comprising means for generating a test signal in an electronic circuit of the monitoring device in response to a programmable test input signal; and means for storing and reproducing upon command in an electronic circuit of said monitoring device one or more of the programmable test input signals.

BRIEF DESCRIPTION OF THE DRAWINGS

In the drawings:

FIGS. 1A–1C together show portions of an electronic circuit for a current voltage monitor in connection with which the impulsive transient hardware simulation in accordance with which the invention may be utilized;

DETAILED DESCRIPTION OF THE ILLUSTRATED EMBODIMENT

If an unobtrusive analog signal source is placed as close as possible to the point where the raw analog enters the system, a test of the entire analog and digital system can be accomplished by injecting test signals using the signal source. The only components that won't be tested are those that occur earlier in the signal path from the point where the test signal is injected. In this case, only a single highly reliable resistor is placed before the injected test signal. A unit that passes a test procedure using a test signal injected at such an early stage of the signal path is very likely to be a good unit since the only component that won't be tested is the highly reliable resistor at the very beginning of the signal path. It's contribution to the many possible failure modes is very small when compared to the many possible failure sources downstream.

High voltage transients can degrade power systems. The high data rates required in transient detection are too fast for the microprocessors in current PMO products to handle by themselves and still perform other data sampling and reporting functions at the desired rate. The occurrence of these transients is often intermittent and unpredictable.

A Transient-Current-Voltage (TCV) Module of the type described in copending U.S. patent application Ser. No. 09/824,414, filed Apr. 2, 2001 solves the problem of unattended detection, storage, and analysis of these transients. The Acquire/Trigger/Control/Interface (ATCI) chip is a component of the TCV and makes the TCV possible. When used in a system with a general purpose microprocessor, the ATCI chip makes possible the continuous real-time detection and storage of high voltage transients on any of three independent channels. The "plug-in" nature of the module makes it easy for the customer to upgrade an existing PMO, such as a current-voltage monitor (CVM) with a TCV by simply replacing the module and downloading the main meter firmware.

As mentioned above, Square D, the assignee, currently manufactures a CVM, known as a CM4 meter. This invention adds transient analysis capability to an existing CM4 meter in a small, relatively low cost plug-in module and enhances the functionality of the CM4. It allows the customer to add transient analysis to the CM4 by simply purchasing the module and upgrading the CM4 firmware. It provides transient analysis capability to customers at significantly lower cost than competitive offerings. The CM4 can analyze data at a rate of 512 samples/cycle. The TCV can analyze data at a rate of 83,333 samples/cycle. Any customer who wants high speed transient analysis in addition to the present low speed analysis can use the TCV.

Figure 1A:
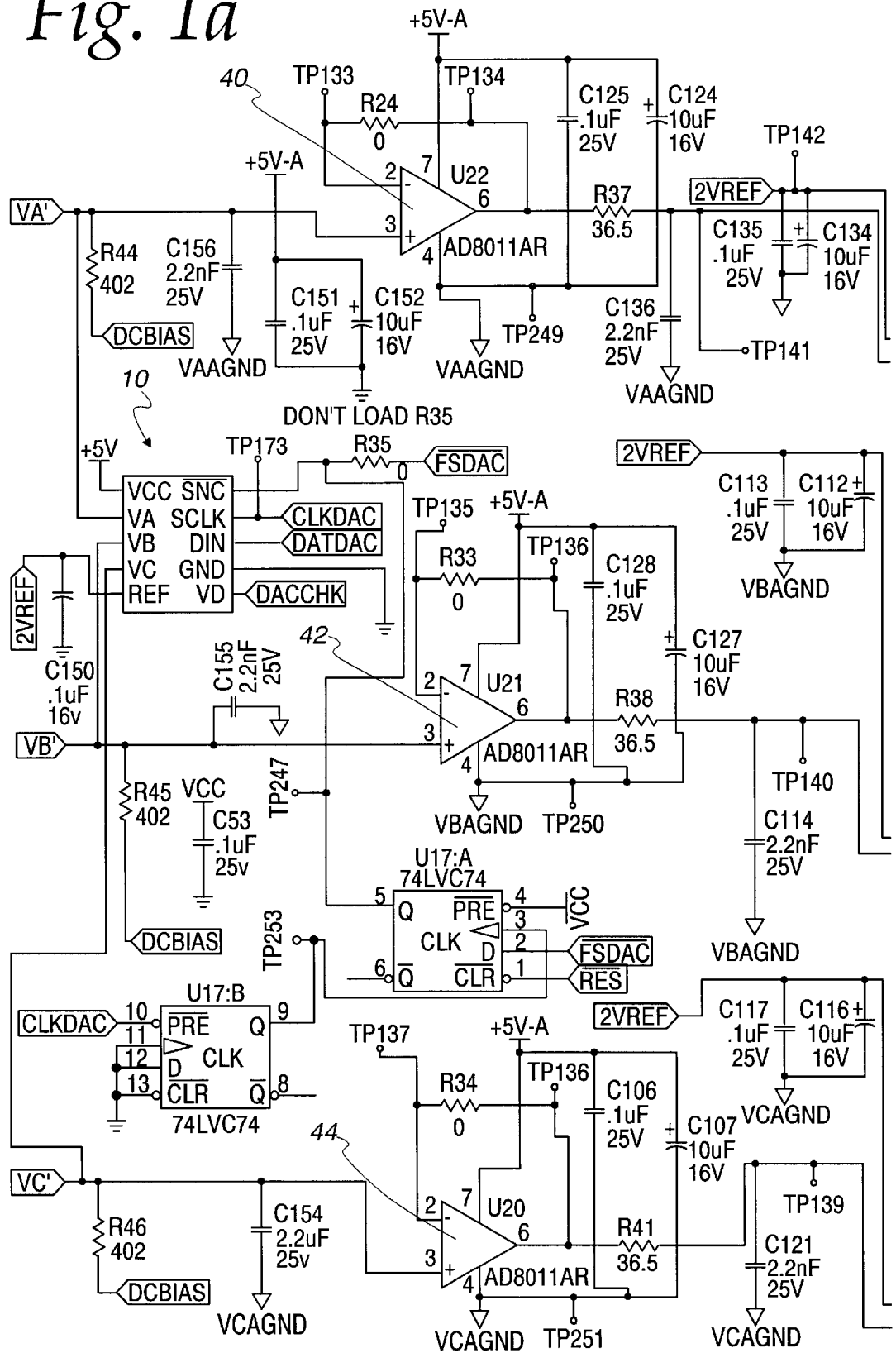

Referring now to the drawings, and initially to FIG. 1A, in the case of testing of the TCV, the signal source mentioned above is a digital to analog converter (DAC) 10 that can be tri-stated. This electrically removes the test signal source from the signal path during normal system operation. However, any time a test signal is desired, the DAC 10 can be turned on, and the test signal generated. This can be done even if the module is installed in the field since the DAC 10 will overdrive the incoming raw voltage signal from the outside world. When normal operation is desired, the DAC can then be tri-stated.

Tri-stating the DAC implies electrically removing it from the circuit by making it look like a very high impedance device to the rest of the circuitry. The high impedance state is the normal state during operation of the transient module. The DAC is activated only during testing. The test signal is programmable and can simulate any waveform that might be encountered during normal system operation.

Figure 1B:
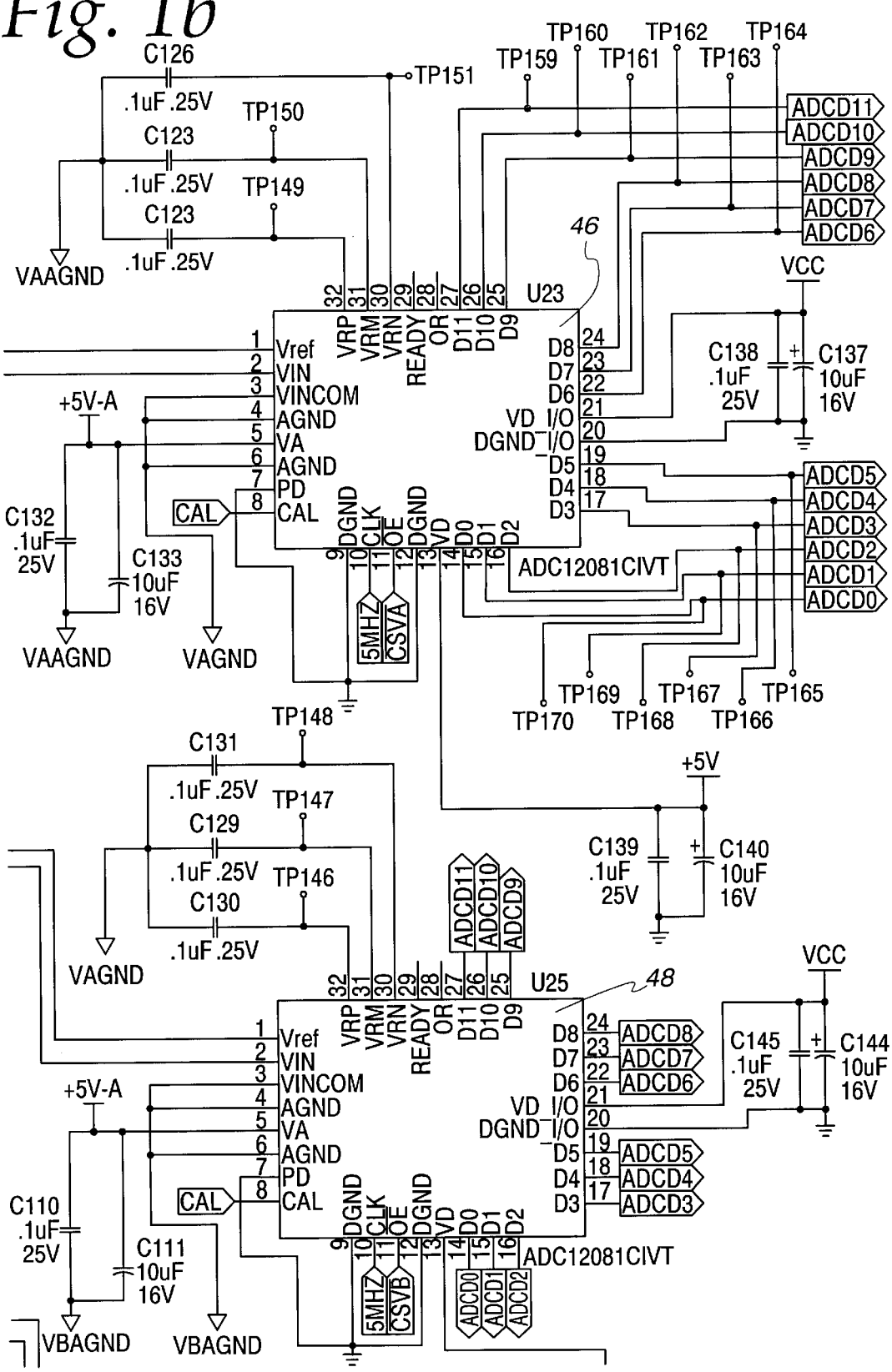
Figure 2A:
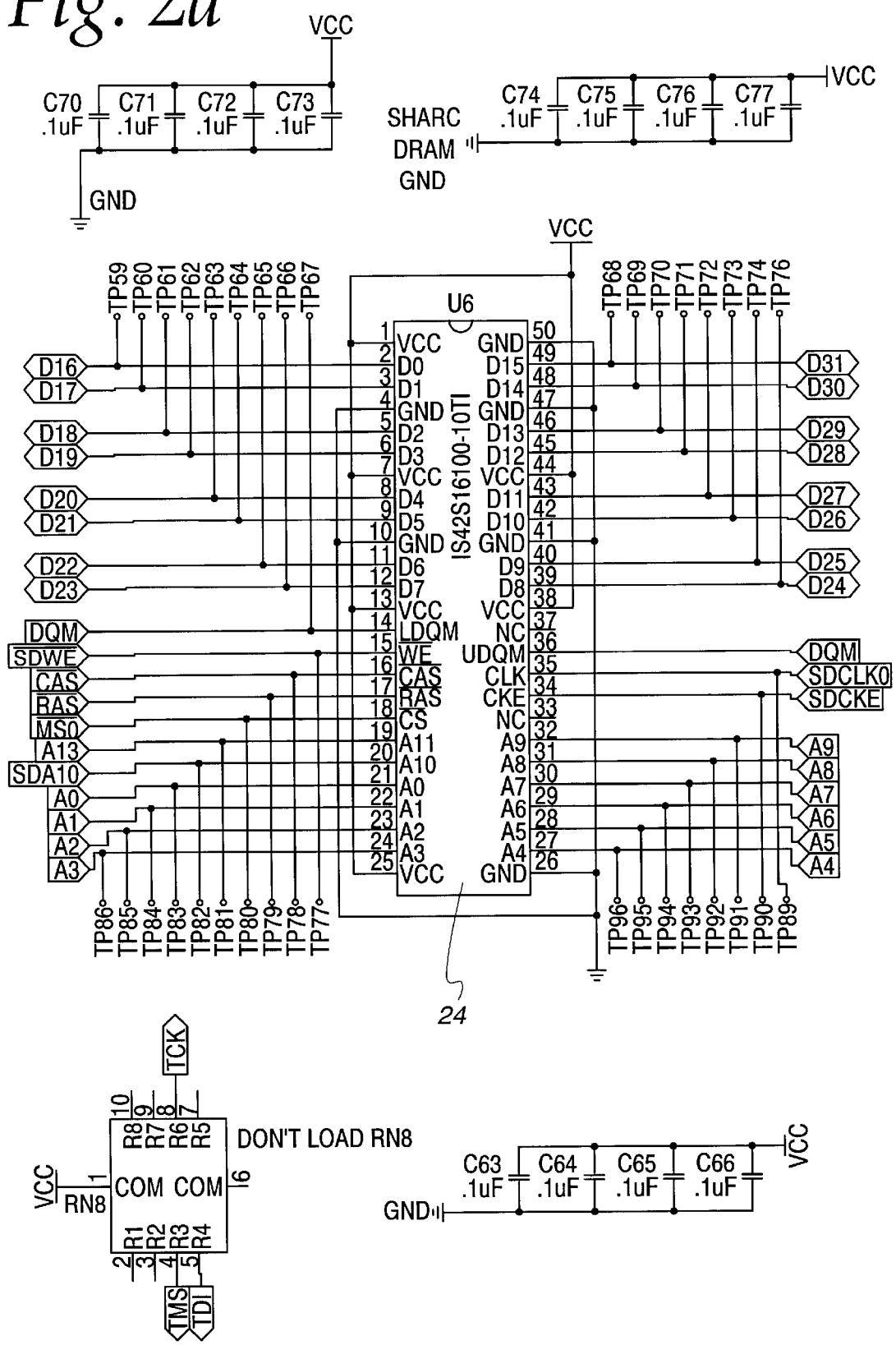
FIGS. 2A–2H together show other portions of a CVM, including a TCV module with an ATCI chip, in connection with which the invention may be utilized.
Figure 2B:
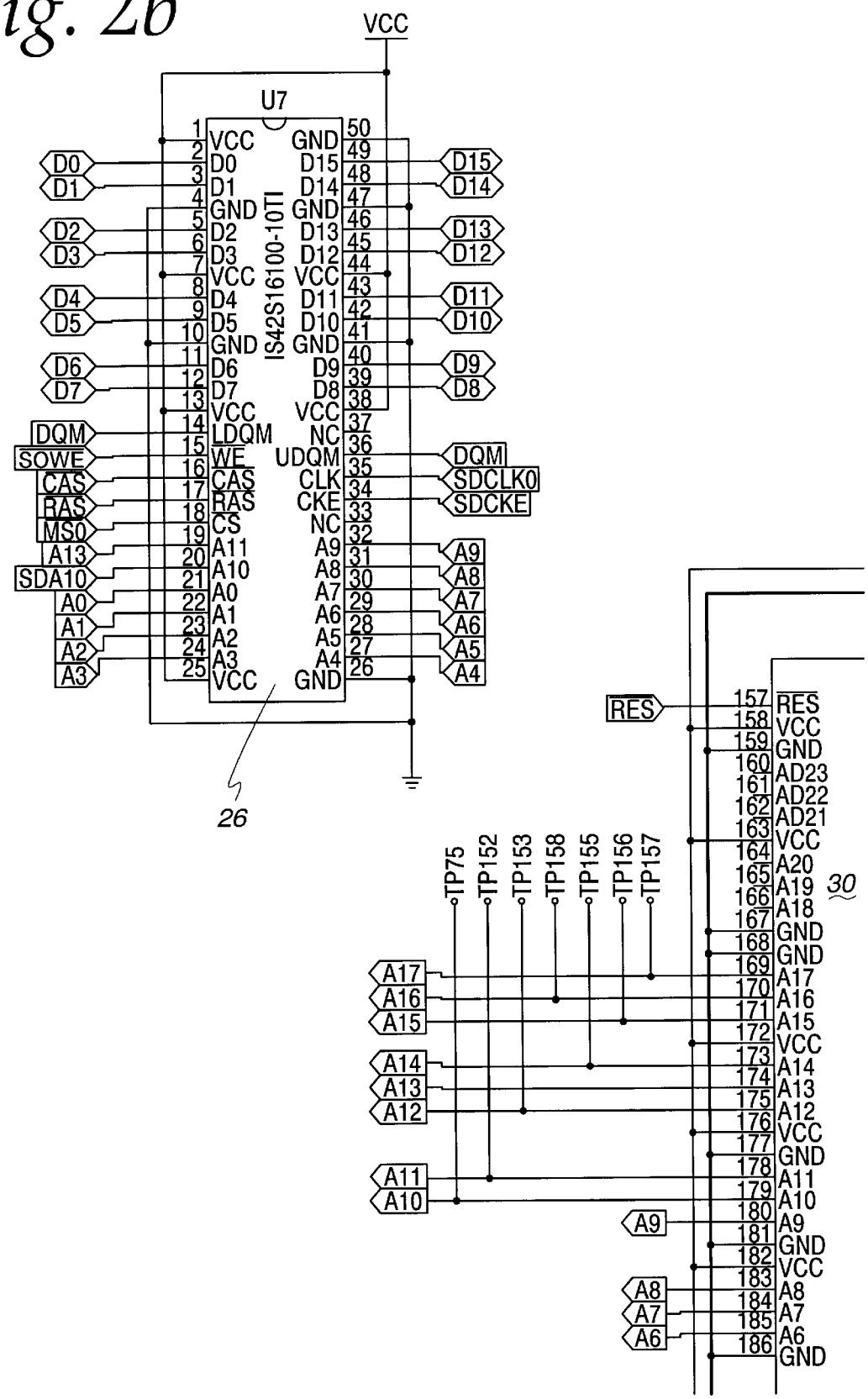
Figure 2C:
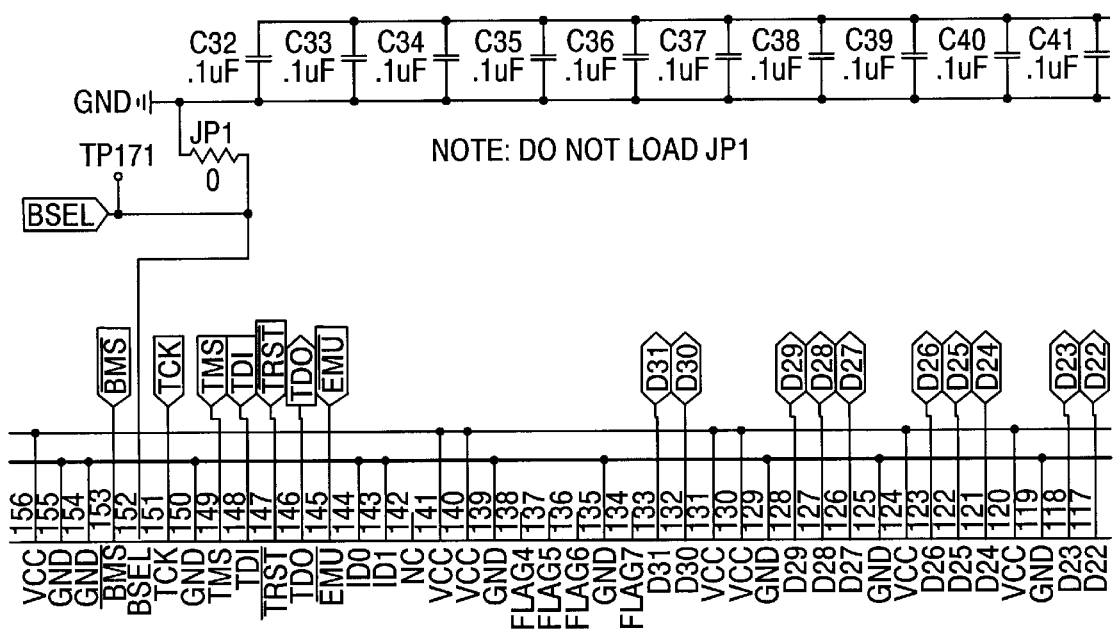
Figure 2D:
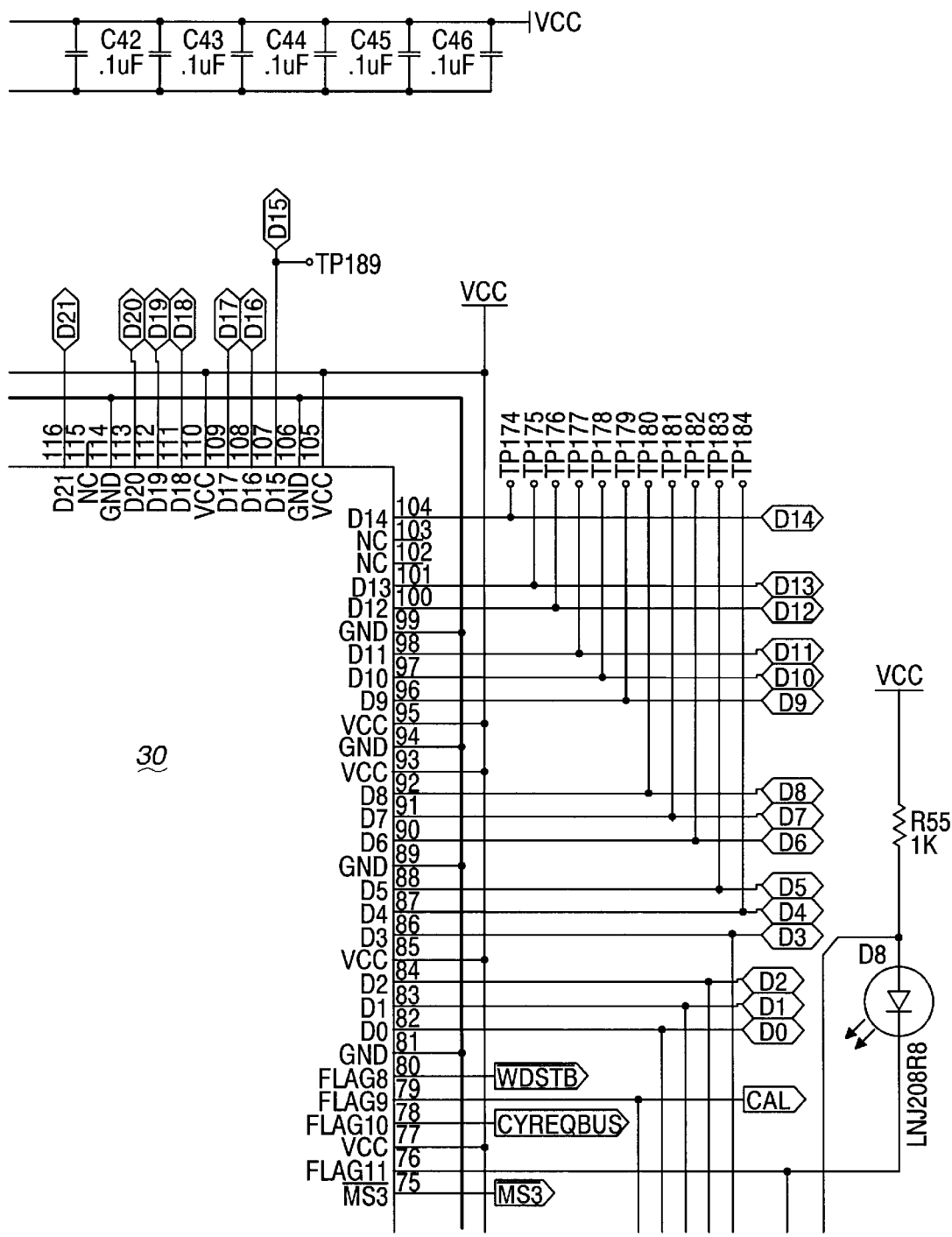
Figure 2E:
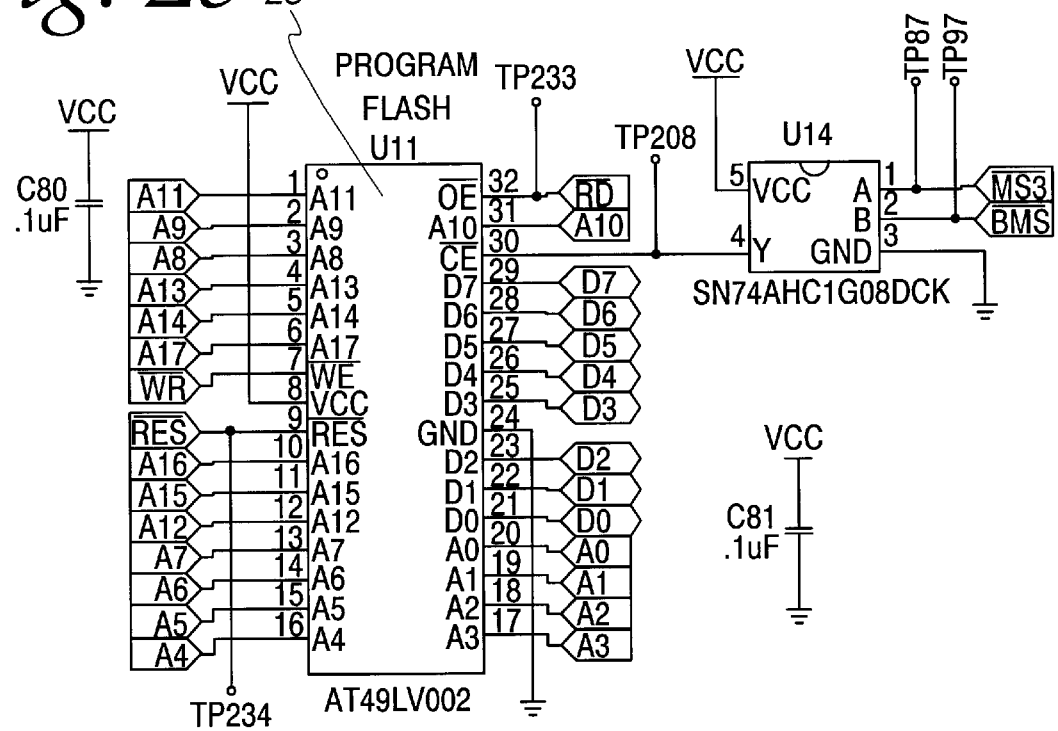
Figure 2E:
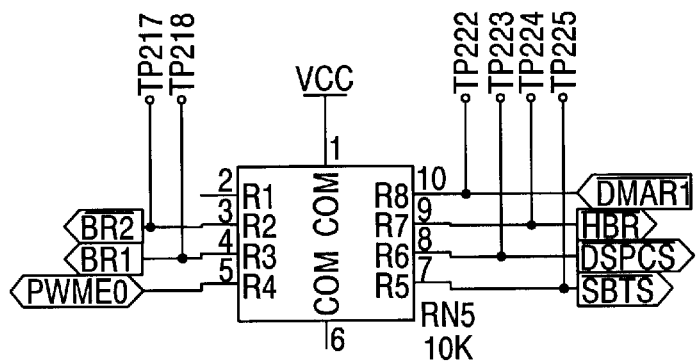
Figure 2E:
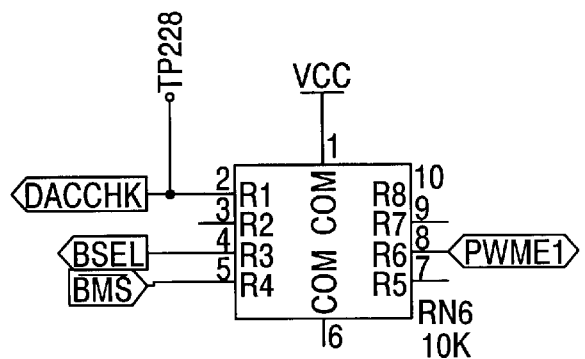
Figure 2F:
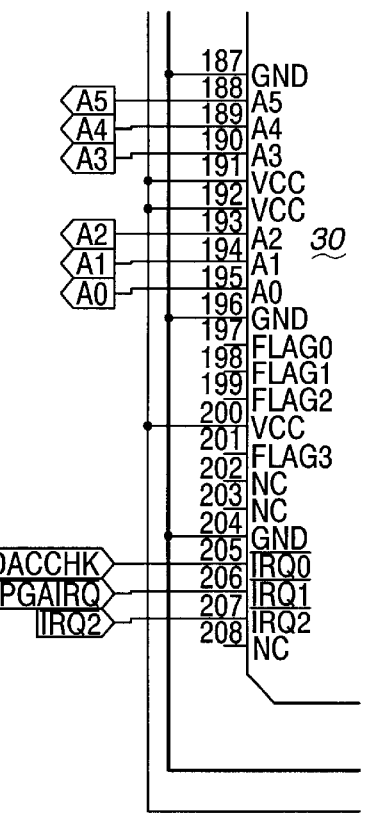
Figure 2F:
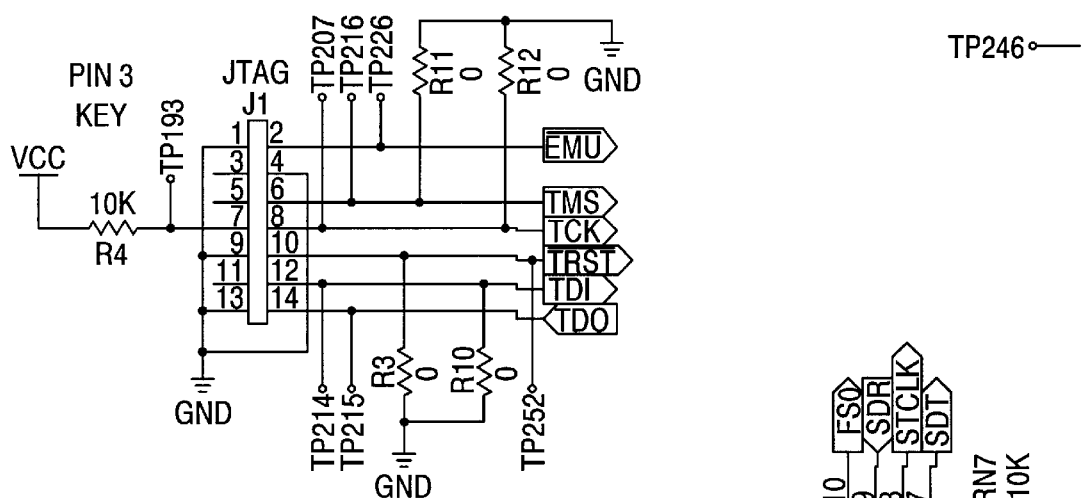
Figure 2F:
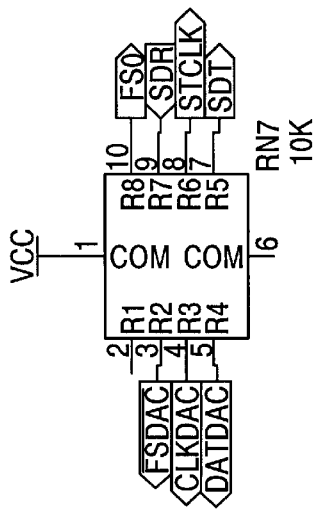
Figure 2G:
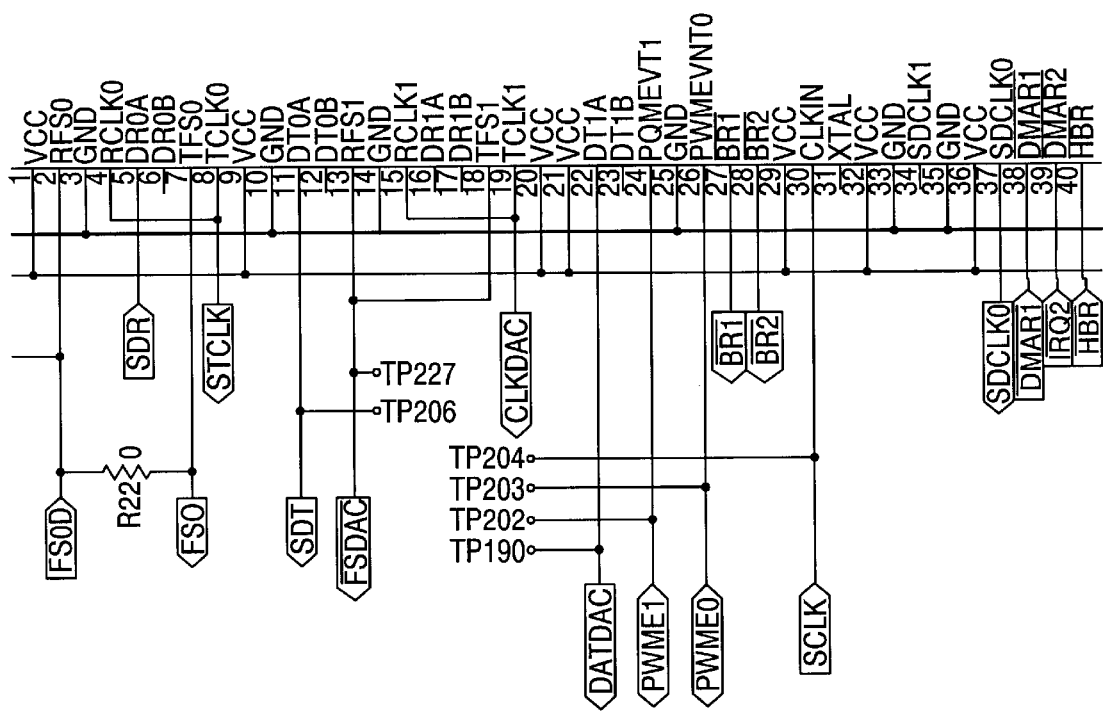
Figure 2H:
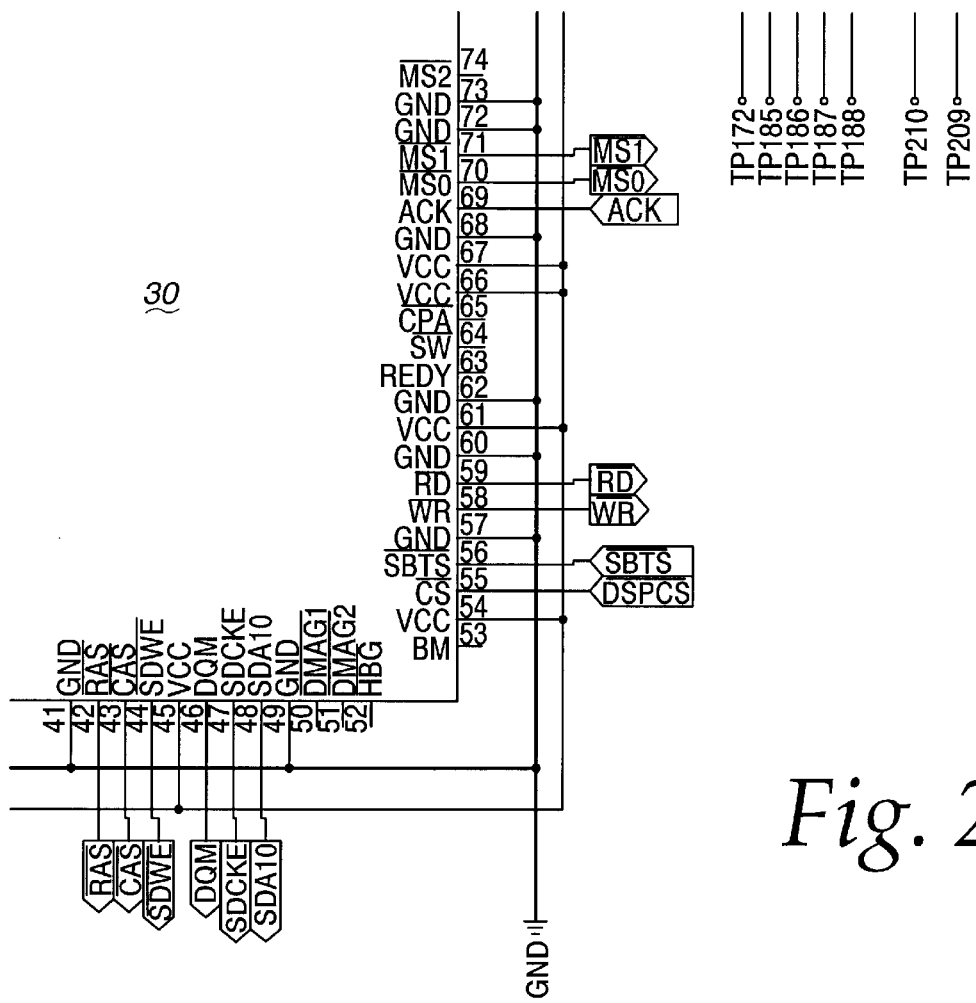
Figure 3A:
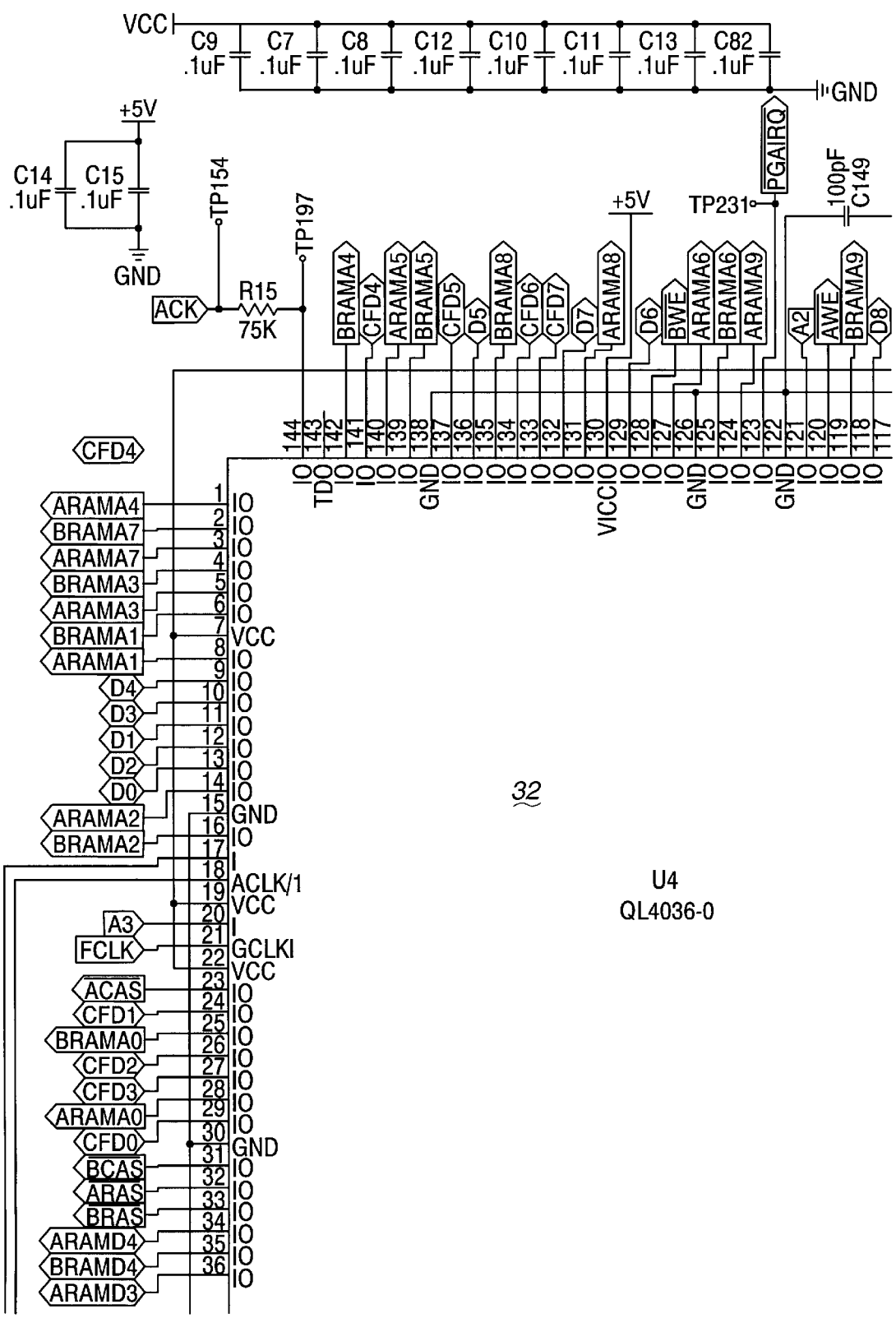
FIGS. 3A–3D show yet other portions of the ATCI chip of FIGS. 2A and 2B.
Figure 3B:
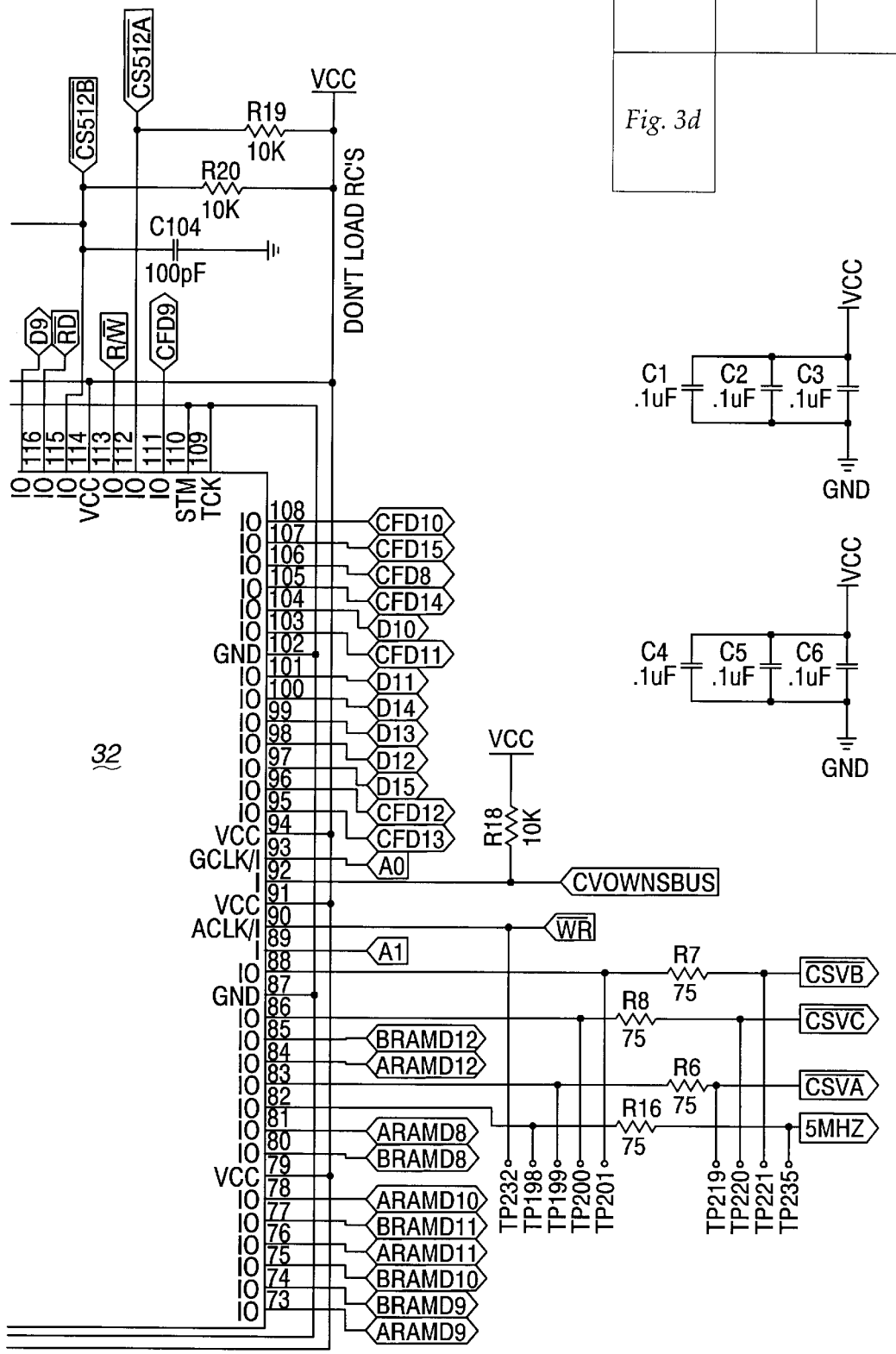
Figure 3C:
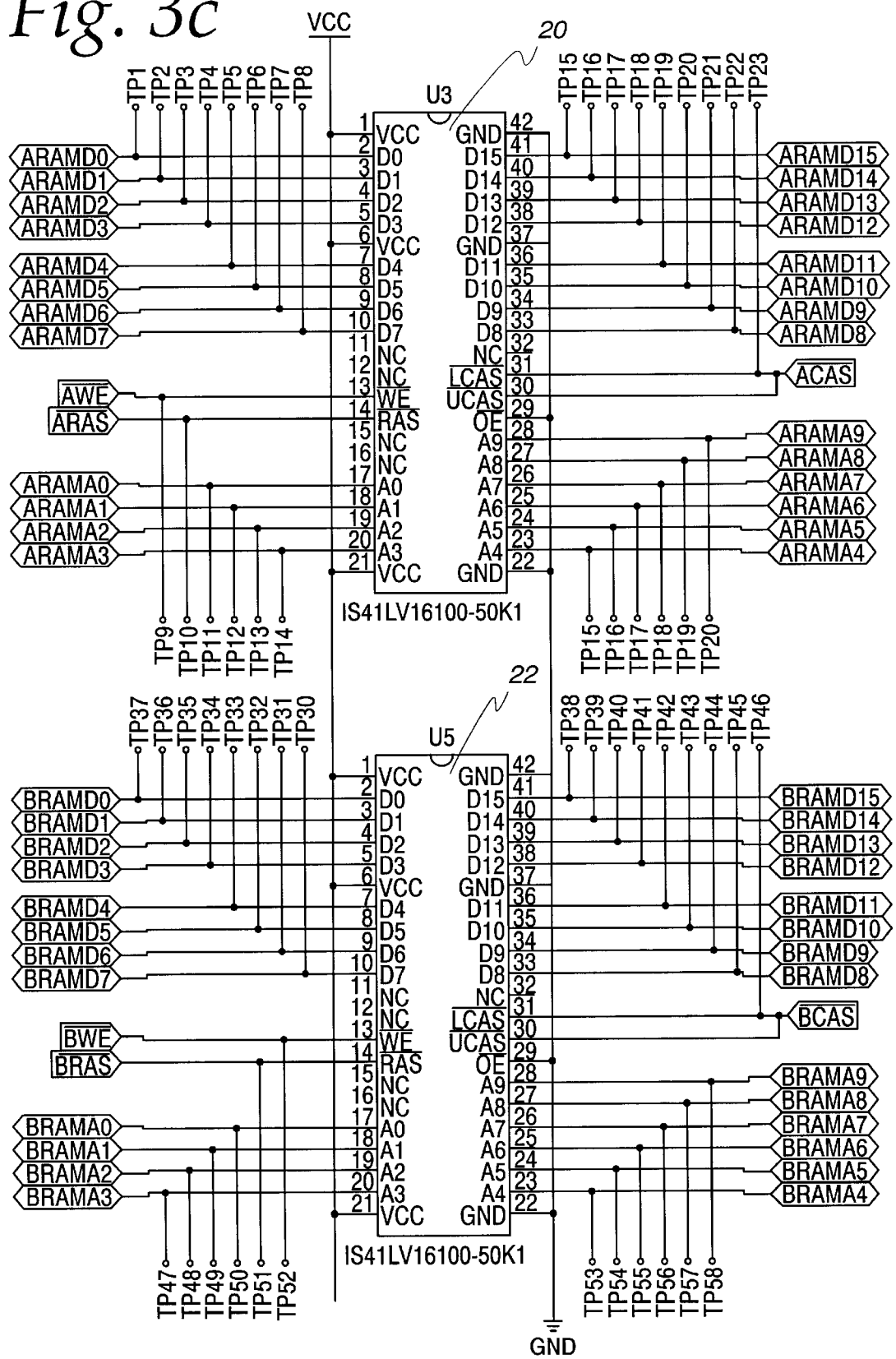
Figure 3D:
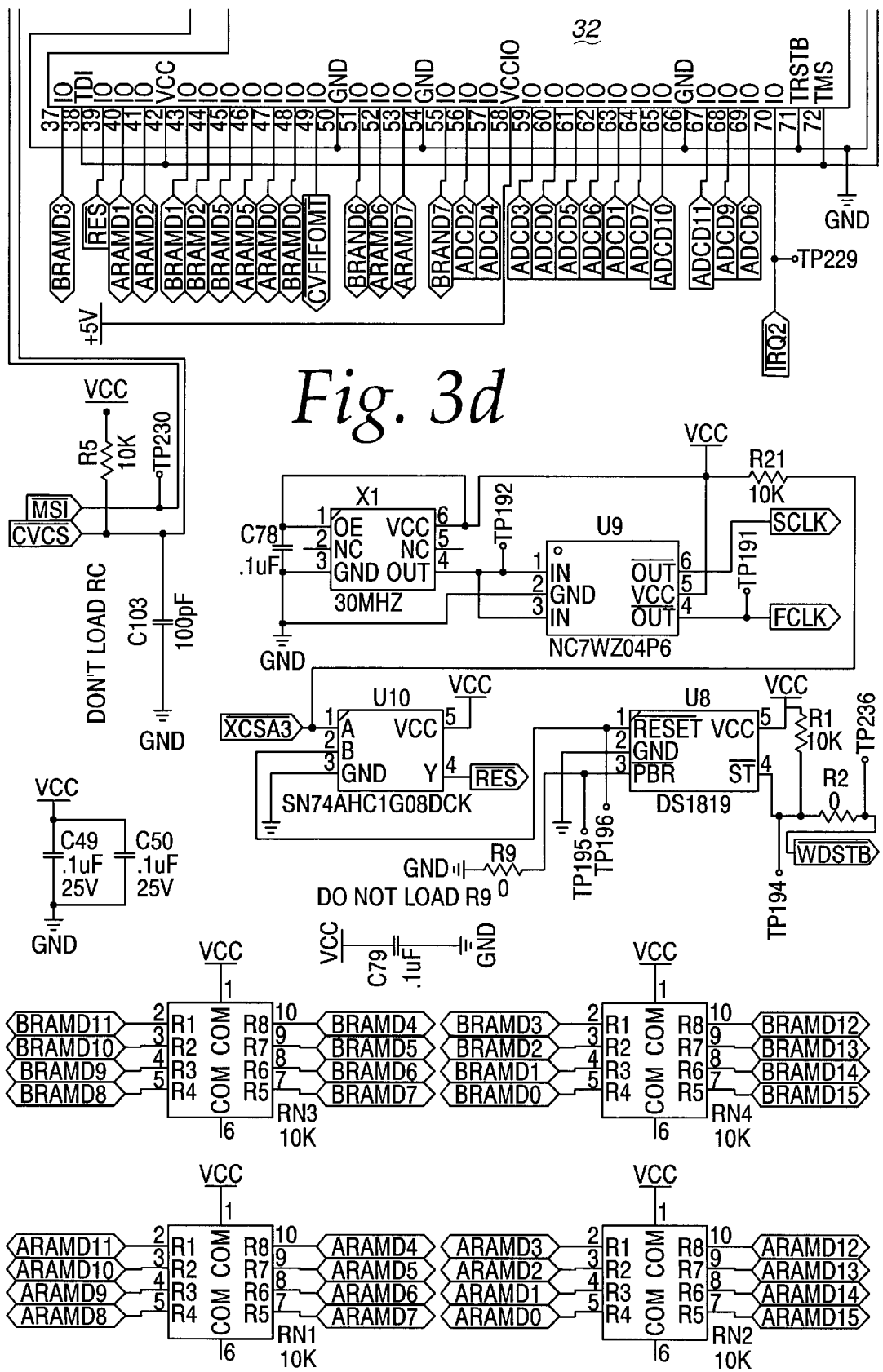

The programmable test signal is stored and reproduced at a memory component of the device, which may be separate digital electronic memory such as DRAMs 24, 26 of FIGS. 2A, 2B, or a programmable flash memory component 28 of FIG. 2E, or an onboard memory of a processor such as a processor 30 of FIG. 2B. The digital-to-analog converter 10 converts the digital signals selected and reproduced from the appropriate memory component, which correspond to programmable input test signals, and produces an analog signal simulating an electrical power waveform based upon the test signal. This analog signal is fed through the inputs of the device, which in the illustrated embodiment comprise a number of operational amplifiers (op-amps) 40, 42 and 44 which in turn feed analog signals through appropriate intervening circuitry to corresponding analog-to-digital converters (ADC) 46, 48 and 50 (FIG. 1B and FIG. 1C). The ADCs 46, 48 and 50 in turn feed suitable digital signals into the inputs of the processor 30 of FIG. 2B. The memory and/or processors may also generate programmable calibration signals for calibrating the digital to analog converter 10 for calibrating the monitoring system.

This is an analog self test function rather than a digital one. This means that it can test both the analog and digital sections of the circuitry rather than just the digital portion normally associated with self tests. It uses an additional part (the DAC) that would not normally be on the board but its benefits override the added cost. It differs from externally generated test signals because it is a part of the unit under test and does not require that the PMO be disabled or that an external signal be supplied to completely test both the analog and digital circuitry.

The DAC can also be used for calibration purposes through a characterization process. This would mean that the invention could completely functionally test and calibrate all the circuitry in the transient module (TCV) in the field without the customer having to physically disconnect the transient module. All that would be required for the customer is to run a test program.

Referring to the remaining figures of the drawings, the TCV (transient/current/voltage) module is an enhanced plug in replacement for an existing 512 samples/cycle CV (current/voltage) module. It offers a much faster, five samples/sec sampling rate for each of three voltage channels and can capture and process voltage transients of up to ±5000 volts. This permits the capture of fast transients that are far beyond the capabilities of the present CV module. In addition to this high-speed capture, low speed 512 samples/cycle circuitry will also be included in the module for high accuracy measurement and compatibility with the present CM4 power monitor made by Square D Company, the assignee.

A fast DSP processor with hardware floating-point capability is used for fast transient analysis and is also available for future enhancements. Both the slow and fast sampled data are available to the DSP so it can offload the main unit Coldfire processor or perform functions beyond the capabilities of the Coldfire if desired.

The TCV module includes (see FIGS. 2A–2B) a high speed Acquire/Trigger/Control/Interface (ATCI) chip and a 60 Mhz ADI Sharc DSP 30 (e.g., Analog Devices ADSP 2106x) and associated memory 24, 26 (FIGS. 2A–2B).

The TCV RESET signal is the first signal that should be mentioned when interfacing the TCV to the main meter (not shown) of the CM4. The processor 32 is a Coldfire processor, which is part of the CM4 device, may be a Motorola 5307 processor, can hard reset the TCV by writing anything to Coldfire address 0x5060000C. Although the TCV has its own power on reset circuitry, this gives the Coldfire the option of resetting the TCV at any time.

In simplest terms the TCV module is a coprocessor for the CM4 monitor. Communications to and from the main meter are accomplished through a 768 word FIFO. From the CM4's Coldfire processor, this FIFO is accessible through Coldfire address 0x50600014. Several handshaking signals are provided to arbitrate access to the common bus. These signals insure that only the main meter or the TCV have access to the common interface bus at any given time.

A general description of the protocol used to access the Interface FIFO can be found in the Bus Interface FIFO Control Protocol section. A table of Coldfire Addresses used to interface with the TCV module is shown below in Table 1.

TABLE 1

| COLDFIRE ADDRESS | FUNCTION | DESCRIPTION |
| --- | --- | --- |
| Coldfire Addresses | | |
| 0x50600006: bit 3 | TCV owns FIFO | Read: '1' ⇒ TCV controls Interface FIFO Read '0' ⇒ Coldfire controls Interface FIFO |
| 0x50600006: bit 2 | TCV FIFO empty | Read: '0' ⇒ TCV Interface FIFO is empty |
| 0x50600014 | Interface FIFO | Read/Write: TCV Interface FIFO |
| 0x5060000C | Reset TCV | Write: Hard reset TCV |

ATCI Chip

Bus size: 16 bits
Chip select: MS1
Address range: 0x1000000–0x100000B
Read / Write ATCI Chip
Bus size: 16 chips
Chip select: MS1
Address change: 0x1000000–0x100000B
Read/Write All data movement between the high-speed A/D converters (ADC) 46, 48, 50, the Sharc 30, and the Coldfire 32 are either directly controlled by or channeled through the Acquire/Trigger/Control/Interface (ATCI) chip. In addition, the ATCI performs triggering calculations that alert the Sharc through an interrupt that a preprogrammed trigger condition has been met. Two ATCI Acquisition 0 RAMs 20 and 22 are also shown in FIG. 1.

The ATCI performs six major functions:
1. Transfer data from the A/D converters to acquisition memory,
2. Provide Sharc access to acquisition memory,
3. Calculate trigger for each incoming data word and interrupt Sharc if trigger threshold is exceeded,
4. Provide acquisition DRAM access and refresh control,
5. Provide an Interface between the Sharc and Coldfire via an Interface FIFO,
6. Provide a FIFO for storing low speed (512 samples/cycle) data for use by the Sharc
7. Registers The ATCI contains twelve registers. Control and system status information is available through these registers. The addresses and a short description of each register is shown in the Table 2. Detailed descriptions of each follow:

TABLE 2

| ATCI Registers | | |
| --- | --- | --- |
| Register | Address | Description |
| Counter Threshold | 0x1000000 | Low going counter threshold trigger set point |
| Counter Threshold | 0x1000001 | High going counter threshold trigger set point |
| Acquire Memory | 0x1000002 | Sharc access to acquire memory (Read only) |
| Interface FIFO | 0x1000003 | Sharc access to Coldfire/Sharc Interface FIFO |
| Status Register | 0x1000004 | Status |
| Threshold FIFO | 0x1000005 | Trigger threshold FIFO |
| Acquire Memory Pointer | 0x1000006 | Points to acquire memory address to read |
| Acquire Memory MSW | 0x1000007 | MS word of current Acquire Memory Counter |
| Switch Point | 0x1000008 | Address of last memory switch point |
| Slow ADC FIFO | 0x1000009 | 8 word FIFO containing slow A/D data |
| Status Register 2 | 0x100000a | Second status register |
| Voltage Threshold | 0x100000b | Voltage trigger set point |

Duration Counter Operation:

Three 12 bit counters (one for each voltage channel) are in the ATCI for the purpose of measuring the length of time it takes a transient to reach the voltage level set in the Voltage Threshold register. Each counter is completely independent from the others and measures only the duration of its assigned voltage channel. As data streams in from the high-speed A/D converters the three channels are addressed in a round robin fashion. Each counter is only addressed when its associated voltage data point is available.

If the absolute value of a voltage data point exceeds the value present in the Voltage Threshold Register and a trigger point has just been reached because the count in the counter exceeds the value in the high-going Counter Threshold Register, the counter will stop counting and hold its count until the A/D converter data is less than the voltage value loaded into the Voltage Threshold Register. Also, when the threshold has just exceeded the value in the high-going Counter Threshold Register, the channel's counter will now begin to be compared with the value in the low-going Counter Threshold Register to provide hysteresis and prevent unwanted triggers. So long as the A/D voltage is ≦ the Voltage Threshold Register, the counter will continue counting down until it reaches 0x000 or another positive-going threshold crossing causes it to begin counting up again. (Counting will also stop if the count value reaches 0xFFF when counting up).

Trigger Point Operation:

When any of the counters crosses the high-going Counter Threshold Register threshold, a Trigger IRQ will occur (if enabled) and a '1' will be placed in acquisition memory at the same address where the trigger occurred. The compare register will also be changed so that subsequent comparisons will be with the low-going Counter Threshold Register (which contains a smaller value). This '1' will now continue to be written into memory every cycle as long as the value of the counter stays above the 12-bit value in the low-going Counter Threshold Register.

Although a '1' will continue to be written into memory, the Trigger IRQ will only occur once when the counter value exceeds the duration threshold. An IRQ only occurs on positive going threshold crossings.

Triggering:

The time that an incoming voltage channel spends above a voltage threshold determines whether the ATCI will signal a trigger condition. In simplest terms, any incoming voltage sample stream that spends a programmed amount of time above a programmed voltage threshold will cause a trigger. Since the incoming voltage stream is AC, the absolute value of each voltage sample point is compared with the value in the Voltage Threshold Register to determine if that point has been reached. Using the absolute value causes loss of the sign bit in the Voltage Threshold Register, thus the register size is 11 bits.

Due to the high data rate, the ATCI breaks up the required trigger calculation into pieces that operate in parallel by employing a pipelined architecture. Although the ATCI is running at 30 MHz, the 15 MHz data rate is too high for the required calculation to finish in a single cycle (the sample rate for each channel is 5 MHz but three channels are sampled in each sample period, thus the 15 MHz data rate). The data in the acquisition memory, the trigger event, and all other high-speed A/D related events are not available until they have been processed through the ATCI pipeline. This delay time is five Sharc 12 clock cycles or 167 ns. The A/D converters have an additional time delay of approximately ten 200 ns periods (2 $\mu$s) from the time the analog signal appears at the A/D input until it reaches the digital output of the A/D. For synchronization purposes, this total 2.17 $\mu$s delay is not significant when compared to the 32.5 $\mu$s sample time of the Coldfire 32.

The ATCI pipeline must be full in order for it to operate at full speed; however, after the first five cycles, the pipeline will always be full. No "fill-time" penalty time is incurred even after a memory switch. The chip will operate at full speed and process and fill the acquisition memory with high-speed A/D converter data at the ATCI's peak rate. After initial power-up, the only other time that the 167 ns "fill-time" penalty will be incurred is if the acquire process is stopped by clearing the EnAqr Bit. When this bit is next set it will take 167 ns for valid data to start appearing again.

Acquisition Memory Addressing

Due to the high operating speed and the special requirements of dynamic memories, a non-sequential addressing method was devised to address the acquisition memory during acquisition of the A/D voltage data. This is a result of the high-speed nature of the data acquisition and required a specialized address counter. To keep things as simple as possible, a copy of the same counter was used on the Sharc side of the acquisition as on the A/D converter side. The Sharc 30 can therefore read the memory sequentially and store the data into its memory using simple linear reads.

The ATCI can simultaneously address two completely independent DRAM's 20, 22. Under normal operating conditions, one of these memories will be in its acquisition mode and one will be available for reading by the Sharc. Setting or clearing the Ram Select Bit in the status register can change the role of each memory. This is in fact the driving force behind the design of the acquisition system. By switching the roles of the memories, the Sharc can read and process the recently acquired data while the system simultaneously collects new data without any loss In order for the system speed requirements and the DRAM refresh requirements to be simultaneously met, an addressing scheme that skips every 16th address was used. This also solved the data alignment problems resulting from the fact that there are three acquired data points, rather than a "power of two".

The counting sequence for the ATCI address counters follows:

0x0, 0x1, 0x2, . . . 0xd, 0xe, 0x10, 0x11, . . . 0xfffd, 0xfffe, 0x0, 0x1, 0x2, . . .

One of the benefits of this counting scheme is that the address of any voltage channel can be easily found by looking at the least significant nibble of the address bits. The remainder of dividing the least significant nibble by three will always point to Va, Vb, or Vc as defined by the following rules:

Absolute trigger mode

If (LsAddrNibble % 3=0) LsAddrNibble=>Va

If (LsAddrNibble % 3=1) LsAddrNibble=>Vb

If (LsAddrNibble % 3=2) LsAddrNibble=>Vc

Differential trigger mode

If (LsAddrNibble % 3=0) LsAddrNibble=>Va-Vb

If (LsAddrNibble % 3=1) LsAddrNibble=>Vb-Vc

If (LsAddrNibble % 3=2) LsAddrNibble=>Vc-Va

The end result of all of this is that every 16th memory word is lost and each 1,048K word memory device turns into a 983K word memory device—a loss of 65K words. It also makes the calculation of time between two data points a bit more complicated. Instead of just subtracting you now have a more complicated algorithm to go through. This becomes important when trying to determine the time between two data points as might be used to find the time a waveform spends above threshold, for example.

The following is one version of how one might find the time difference between two addresses A1 and A2.

$$\Delta A = \left(A_1 - \frac{A_1}{16}\right) - \left(A_2 - \frac{A_2}{16}\right)$$

Or, using shifts, $$\Delta A = A1 - (A1 >> 4) - [A2 - (A2 >> 4)] \tag{1}$$

Since three voltage samples are read every 200 ns the time between samples is 66.6667 ns. This is not precise, (see below) but for the purposes of this calculation we'll assume the calculation still works. The time between the two points can be obtained as follows:

$$\Delta t = \Delta A * 66.66667 \text{ ns}$$

A further complication arises as a result of rollover. So, if the number is negative:

$$\Delta t = 0xF0000 + \Delta t$$

This give the time difference between any two data points but in reality, all time stamps are the same for each voltage triplet Va, Vb, and Vc. This fact can be used to find the exact time between two data points without resorting to floating point arithmetic.

The three voltages are not really 66.6667 ns apart; Vb and Vc share the same time stamp as the Va that immediately precedes them. Equation (1) can be modified to reflect this. In equation (2), the terms [Δx−(Δx>>4)]/3 will always be exact and have no remainder.

$$\Delta t = \{[A1-(A1>>4)]/3-[A2-(A2>>4)]/3\} * 200 \text{ ns} \quad (2)$$

If a rollover occurs, then the same logic applies as in the previous calculation except that the 0xF0000 term must be changed to 0x50000 since everything was divided by 3. The time difference then becomes:

$$\Delta t = 0x50000 + \Delta t$$

The above section applies only to ATCI addressing. The Sharc 30 reads the data in the acquisition memory through Acquire Memory Register port. The ATCI increments automatically and requires no intervention from the Sharc 30. Once the data is in Sharc (30) memory, however, it will look like a contiguous array and none of the above rules apply. The data is stored in contiguous memory addresses with no skipped addresses. Since the Acquire Memory Pointer is only 16 bits wide, the least significant four bits of the 20-bit memory address are cleared when the pointer is written. This means that Va will always be the first channel read from acquisition memory (Va–Vb in differential mode).

In this mode, the data transfer from the ATCI to the Sharc internal data memory is fully automatic after the DMA chain table is loaded and the DMA is started. The DMA transfer will occur without any intervention from the Sharc except for DMA interrupts that will be set in the chain table to allow processing of the data at programmable intervals (See the Sharc User's Manual). Operation proceeds as follows:

Approximately every 32 μs, the Sharc 12 is required to read in eight words of data from the Slow ADC FIFO 28. This is a continuous high priority requirement regardless of any other tasks that the Sharc may be doing. The overhead required to do this simple data move with an IRQ is very high. A much more efficient way of accomplishing this is to use one of the Sharc's external DMA channels. Sharc external hardware DMA channel 2 (the highest priority external channel) is used for this purpose. For some strange reason, Analog Devices connects hardware DMA channel 2 (DMAR2 pin on the chip) to the external DMA0 variables in the Sharc 'C' definitions macros file. Software wise, the highest priority external DMA channel is '0' and this is the one used for the low speed data DMA.

The ATCI sends eight DMA requests to the Sharc 12 each time the Slow ADC FIFO 28 fills. Each request results in the Sharc reading a word from the FIFO. After eight reads the ATCI terminates any more requests until the next 32 μs boundary.

The Slow ADC FIFO 28 is just like any other memory address and can be read with software. But when used with DMA care must be taken to insure that data is not corrupted. The DMA begins operation when the Slow ADC FIFO fills. From this point, the ATCI will request a new DMA word transfer each time that the Sharc reads the Slow ADC FIFO address (eight times per 32 μs cycle). This will happen whether the read was the result of a software instruction or a DMA transfer. For this reason, software reads of the FIFO must be timed not to interfere with DMA transfers or corrupted data will result.

If it's ever necessary to turn off DMA for a single 32 μs cycle, for example, all setups (enabling interrupts, disabling DMA, etc.) must be accomplished within the 25 μs window of inactivity or corrupted data will result.

To use the DMA mode, set up and enable the Sharc external software DMA channel 0 to "paced master mode". This will allow it to interpret the signals from the ATCI as DMA requests. Also, make sure that Sharc external IRQ 2 is disabled (set to '0' in the Sharc IRQ enable register) and set the Slow FIFO IRQ bit to '0' (default).

Setting up the DMA chain table, starting the DMA, and setting up the memory for short words is not straightforward but I do have code that will accomplish it and have verified that the transfers are very fast and have a higher priority than the other external DMA channel. The Sharc automatically preempts ongoing DMA 1 transfers (such as one that may be ongoing from the ATCI acquisition memory or Interface FIFO) and reads the eight slow speed data words before proceeding with the current DMA 1 transfer.

If the ATCI is not being accessed the transfer speed of all eight words is about 800 ns. If the ATCI is being accessed (such as using DMA 1 to read data from the acquire memory at the same time that DMA 0 is running), the data rate will be a bit slower. Because of the Sharc arbitration scheme, if DMA 1 is running the DMA 1 and DMA 0 transfers are actually interleaved until the eight slow speed data words are completely transferred. But even with the arbitration delays, the transfer of all eight words happens less than 1.5 μs from the time the Slow ADC FIFO is filled. This means that only about 7 or 8 μs is used worst case out of the total of 32 μs to transfer the data from the ATCI to the Sharc internal memory even if the Coldfire DMA transfer time is included. The remaining 24 to 25 μs should be enough to process any DMA related interrupts that are loaded in the DMA chain table.

Using DMA "chaining" any number of 8-word blocks can be loaded into internal memory with no direct program intervention or even knowledge. This is a much more efficient means of moving the data. If done properly, the chaining table can be set up at initialization and left untouched afterwards. DMA IRQ's can be inserted in various parts of the table (every quarter or half cycle, for example) to alert the processor to process the previous data. In this mode, the Sharc 12 and ATCI 10 will transparently work together to load the slow ADC data into memory with minimal CPU intervention.

Trigger IRQ Bit

Bit: 2

Read/Write

Status at Reset: '0'

Bit 2 is used to determine if an interrupt caused by a programmed trigger event has occurred. Reading a '1' means that a trigger IRQ has occurred. A '0' indicates that a trigger event has not occurred.

Writing to this bit is not completely straightforward. (see Writes to the Status Register section). Writing a '0' to the bit will clear and disable the interrupt. Writing a '1' does not cause an interrupt to occur but enables the hardware to allow an interrupt. This is an important distinction and if the bit is not properly programmed inadvertent loss of interrupts will occur. So in order to be ready for the next interrupt, this bit must first be cleared then set. This IRQ, the OwnGoesHiIRQ, and the OwnGoesLoIRQ all share Sharc IRQ 1 so firmware will have to determine the event that caused the interrupt.

OwnGoesHiIRQ bit

Bit:1

Read/Write

Status at Reset: '0'

This IRQ is provided to allow the Sharc 12 to process data without continuously polling the CvownBus bit. The Bus Interface FIFO Control Protocol provides a way of using the edges of the CvownBus bit to determine when data can be transmitted or received from the Coldfire. This IRQ could be used to determine when the Coldfire is finished transmitting a message to the Sharc 12. If the Coldfire 14 owns the Interface FIFO, the CvownBus bit will be low and the Sharc 12 will be unable to get control of the bus again until the Coldfire releases it by writing a '1' to its request bit. However, the Sharc can still write a '0' to its Flag 10 bit.

When the Coldfire releases the FIFO this interrupt will fire (if enabled) because the CvownsBus signal will go from low to high signifying that the Sharc now has control of the Interface FIFO.

This IRQ, the Trigger IRQ, and the OwnGoesIRQ all share Sharc IRQ 1 so firmware will have to determine the event that caused the interrupt.

OwnGoesLoIRQ bit

Bit:0

Read/Write

Status at Reset: '0'

This IRQ works the same as the OwnGoesHiIRQ but uses the high to low going edge of the CVownBus signal. To use this IRQ the CvownBus bit would initially be a '1' meaning that the Sharc has control of the bus. The Sharc would then set its Flag 10 bit to '1'. This alone would not cause FIFO ownership to change. The Sharc would maintain control of the FIFO until the Coldfire sets its request bit to '0'. This would cause FIFO ownership to change and the CvownBus bit would transition from high to low and cause this IRQ to fire.

At this point the Coldfire would have control of the bus and the Sharc would not have access to the FIFO. It would just signal that the Coldfire is now doing something with the FIFO but isn't finished. The Sharc could use this interrupt to then enable the OwnGoesHiIRQ and set it's request bit to '0'. This would trigger the OwnGoesHiIRQ when the Coldfire is finished using the FIFO.

This IRQ, the Trigger IRQ, and the OwnGoesHiIRQ all share Sharc IRQ1 so firmware will have to determine the event that caused the interrupt.

Threshold FIFO Register (50)

Bus size: 16 bits

Address=0×1000005

Read only

Every time a transition (either positive going or negative going) through a threshold point defined by the Voltage Threshold Register 40 and the Counter Threshold Registers 42 occurs, an entry is made into this 21×64 Threshold FIFO. An entry is made for each transition, whether it's positive going or negative going. Twenty bits of the Threshold FIFO are dedicated to the address where the transition occurred and one bit is dedicated to the direction of the transition—'1' indicates positive going and '0' indicates negative going. Since the ATCI 10 interfaces to the Sharc 12 through a 16-bit bus, the data in the Threshold FIFO 18 is divided into two parts.

This register contains the 16 most significant bits of the 20-bit address contained in the FIFO 50. The least significant four bits of the 20-bit address and some other status about the Threshold FIFO 50 are contained in Status Register 58.

Reading this register 50 automatically increments the FIFO read counter this register is read after Status Register 58 is read (reading Status Register 2 does not increment any FIFO pointers). Placing the 16 bits of an the Threshold FIFO register in bit positions 19 through 4 and then placing bits 3 through 0 of the Status Register 2 into bit positions 3 through 0 of this newly formed long word will result in the 20-bit address of a threshold crossing point in acquisition memory.

Up to 64 threshold crossings can be stored in the Threshold FIFO. Any additional crossings will be lost. The FIFO will not roll over so the original data will not be lost but any additional threshold crossings will.

An example of how this FIFO might be used and how to interpret the addresses stored in the FIFO can be found in the Acquisition Memory Addressing section.

Acquire Memory Pointer Register (52)

Register size: 16 bits

Address=0×1000006

Read/Write

This register 52 contains the most significant 16 bits of the address that will be read the next time the Sharc reads the acquisition memory through the Acquire Memory Register. Since the acquisition memory requires 20 bits to access its full range, this means that the least significant four bits of the address are set to 0×0 when this register is written. Therefore, the starting point for any Sharc read of acquisition memory will always occur on a 15-word boundary. All acquisition memory locations can still be read (subject to the restrictions of the Acquisition Memory Addressing section), but the starting point of each read sequence will always occur on a 15-word boundary.

The counting sequence of this pointer (including the hidden least significant nibble) is shown below:

0×0, 0×1, 0×2, . . . 0×d, 0×e, 0×10, 0×11, . . . 0×ffffd, 0×ffffe, 0×0, 0×1, 0×2, . . .

Acquire Memory MSW Register

Register size: 16 bits

Address=0×1000007

Read only

This register contains the current most significant 16 bits of the acquisition memory counter.

Switch Point Register 56

Register size: 16 bits

Address=0×1000008

Read Only

This register 56 contains the least significant 16 bits of the address where a memory switch has actually occurred. The most significant four bits of the address are in bit positions 8 through 5 of Status Register 2. The combination of data from these two sources forms a 20-bit address that points to the first address of acquisition memory loaded by the high-speed A/D converters after a memory switch has occurred.

Coldfire/Sharc Synchronization:

The following description only applies when interrupts are used to transfer data between the Slow ADC FIFO and the Sharc 30. DMA mode is self-synchronizing and requires no synchronization procedure.

The Coldfire 32 and Sharc 30 low speed data captures must be in sync if their data is to match. Conditions such as the Coldfire and Sharc powering up at different times or a Coldfire reset command to the Sharc using the Reset TCV chip select can cause the Coldfire to be out of sync with the Sharc. If this happens, the Sharc data will be either corrupt or out of sync at best (the Coldfire data won't be affected by this condition).

The Coldfire 32 gets eight words of data from the low speed A/D converters every 32 $\mu$s. As explained above, the Sharc gets the same data using the Slow ADC FIFO Register. Care must be taken to insure that the data streams match. Observation of the Coldfire/Sharc interface bus has shown that the maximum transfer time for the eight slow A/D channels is about 7 $\mu$s. This leaves about 25 $\mu$s of idle time in each transfer cycle where synchronization can be safely accomplished.

One method of synchronizing the Sharc and Coldfire would be to use this idle time to clear the Slow ADC FIFO word counter during this idle time since this is the only time that Coldfire access is guaranteed not to be ongoing. The counter is cleared every time that the Slow ADC FIFO is read.

The sync method would proceed as follows:

Wait for a Slow ADC FIFO full condition by polling the Slow ADC FIFO full Bit. When this happens, the Coldfire is somewhere in it's 7 $\mu$s active DMA cycle, we just aren't sure where. All synchronizing activity has to occur in the 25 $\mu$s idle time in order for it to work. The optimum place to do the sync would be as quickly after we are sure that the Coldfire is not actively acquiring data. Since the maximum time that it takes the Coldfire to acquire all data is 7 $\mu$s, if we add some margin and wait, say 15 $\mu$s, before we sync the FIFO, we'll guarantee that the next FIFO cycle will be in sync. Waiting 15 $\mu$s from a FIFO full condition will guarantee that the sync point will be at least 8 $\mu$s and at most 15 $\mu$s into the 25 $\mu$s idle time.

A timer could be used to measure this time and the timeout could be polled to determine when the timer expires. If a single FIFO read is done at this time, the FIFO counter will be cleared and will have to count to 8 before the next interrupt will occur. This synchronizes the Sharc and Coldfire.

This is a rather tight time schedule and polling rather than a timer interrupt might be used to accomplish it.

If timer interrupts are usable for synchronizing the two processors, this will allow synchronization to occur on an ongoing basis every N cycles and will result in a more robust design than simply synchronizing once at reset.

Test DAC

An Analog Devices AD5324 four-channel test DAC 10 is included on the PC board for in-circuit test purposes and is accessible through Sharc 30 serial port 1. It can be used for application development or as the stimulus for a complete end-to-end system test. Channel 1 of the DAC is connected to input voltage channel Va, channel 2 is connected to Vb, and channel 3 is connected to Vc at points just before the input amplifiers and after the input divide down resistors.

Because of this placement, all of the analog and digital acquisition circuitry can be tested with the DAC. The DAC is 12 bits wide and has a rise and fall time of about 0.7V/us. Though this is relatively slow, it's adequate for in-circuit test purposes. When not active, it can be placed in its power down state. In this state, the outputs are tri-stated the TCV will acquire data from the divide down resistors without being affected by the DAC.

Figure 5:
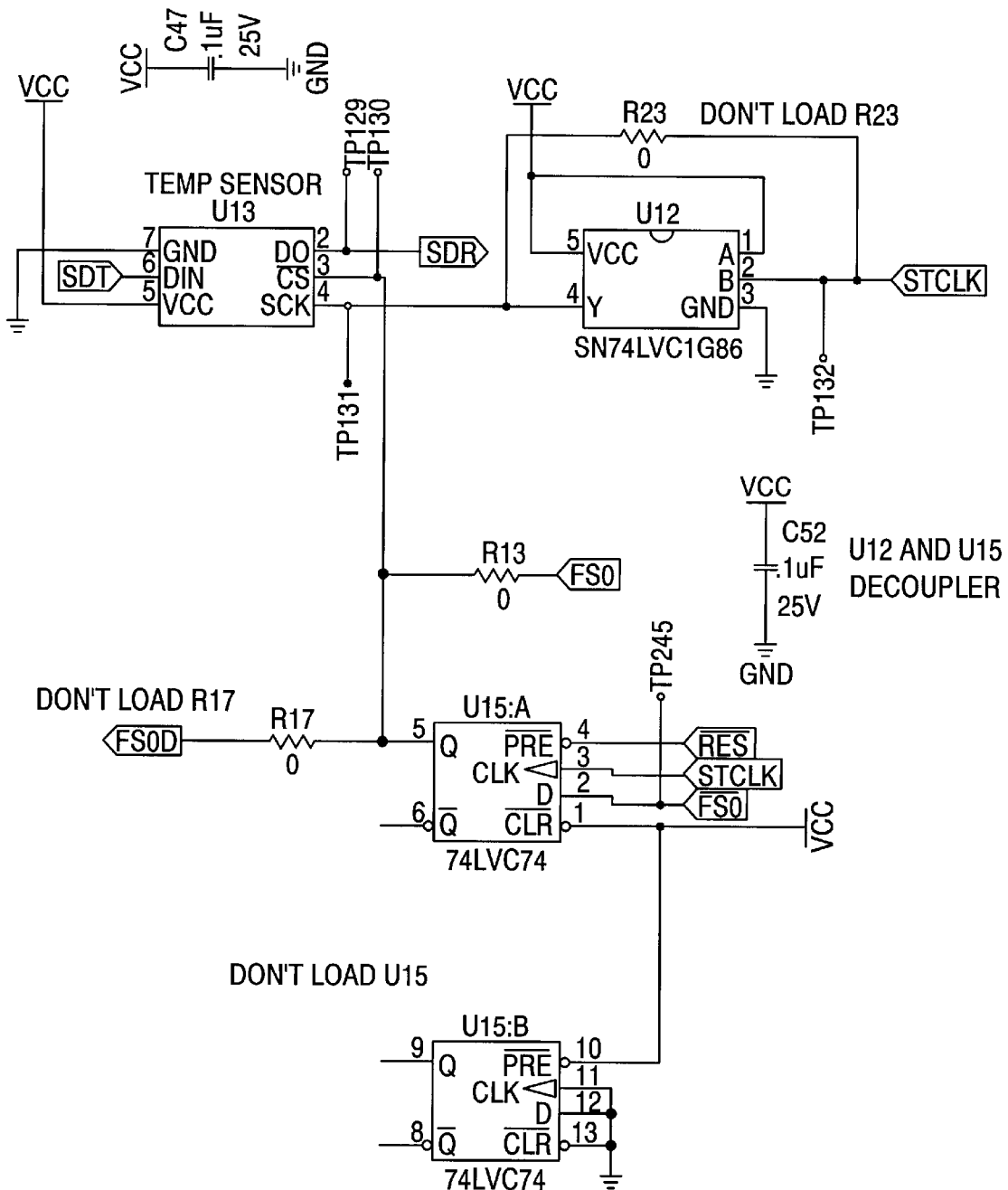
FIG. 5 shows a temperature compensation circuit which may be used with the foregoing circuitry.

Temperature Sensor (FIG. 5)

An AD7814 temperature sensor is also present on the PC board And can be accessed through Sharc serial port 0. It will be placed physically close to the high-speed A/D converters and can be used to monitor the temperature around the devices and make calibration adjustments if necessary.

High speed Analog

The three A/D converters (ADC) convert voltages from three channels into digital values. These values are sequentially read, preprocessed, and stored to acquisition memory by the ATCI chip.

The high-speed analog section of the TCV consists of three 12-bit A/D converters and associated buffering circuitry. The A/D converters provide voltage data to the system at a 15 Mhz data rate (three channels at 5 Mhz each). The data is read by the ATCI and written to acquisition memory.

Transient voltages of up to +5000 volts peak can be provided to the digital circuitry.

Low speed Analog

Two A/D converters (ADC) 46, 48, 50 convert four voltages and four currents into digital values. The outputs of these A/D converters go to both the Sharc 12 and Coldfire 14 processors so the same low speed data is available to each processor.

Figure 4:
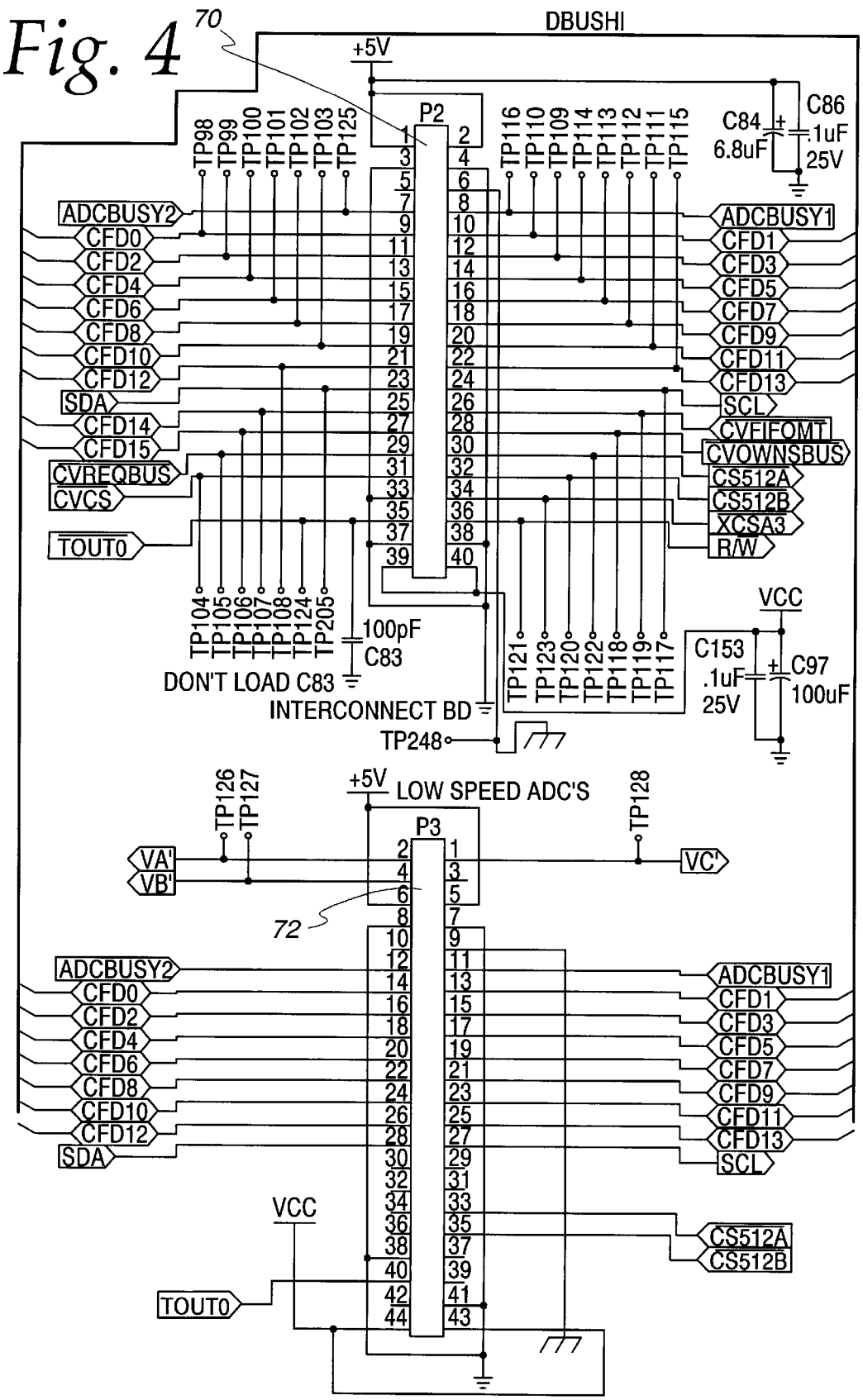
FIG. 4 shows a pair of analog digital converters which may be used with the ATCI of FIGS. 2A-B and 3A-B.

The low speed A/D converters 70, 72 (FIG. 4) used are the same as the present CV module. However, since bits 15 and 14 of the TCV are used as Coldfire signaling bits, the Coldfire software will change somewhat when the TCV module is used in place of the present CV module. In the present meter bit 13 is sign extended into bits 15 and 14. The TCV uses bits 15 and 14 as Coldfire signaling bits and therefore bit 13 is the only sign bit. When the Coldfire DMA reads the slow speed A/D converters, the TCV transmits the two Coldfire signaling bits (Signal Coldire Bit A and Signal Coldfire Bit B) directly from the Status Register to the Coldfire in bit positions 15 and 14 of the low speed ADC data.

The Sharc 30 and Coldfire 32 have access to the same low speed data (as long as the signaling rules are followed). The Sharc can therefore be used as a coprocessor in processing the 512 samples/sec data and thus offload the Coldfire if desired. Since the Sharc is a much more efficient numeric processor, this opens up many new applications that were not feasible if the Coldfire is the only processor available.

CPU

The central processor for the TCV module is the ADI Sharc DSP 30 (e.g., Analog Devices 21065). The CPU section includes of the Sharc 30 includes 256 Kbytes of field programmable flash memory, 4 Mbytes of DRAM, reset circuitry, and a temperature sensor.

CPU 10 Flags

Flag 8—Watchdog Timer

This flag is attached to the external watchdog timer. If it isn't switched at least once per second, a hardware reset will occur.

Flag 9—Calibrate High Speed A/D Converters This flag is attached to all three high-speed A/D converters and is used to calibrate them.

Flag 10—Request Interface FIFO Control

This CvownBus bit requests control of the Interface FIFO by writing a '0' to this bit. Writing a '0' requests Sharc control of the Interface FIFO. Writing a '1' will release control of the FIFO to the Coldfire whenever, but not until, the Coldfire requests control. Control of the Interface FIFO is determined by the status of the CvownBus bit.

Flag 11—Heartbeat LED This flag is attached to a heartbeat LED. Writing a '0' turns the LED on.

Bus Interface FIFO Control Protocol (see FIG. 3)

An arbitration circuit on the main meter Digital Board determines whether the Sharc 30 or the Coldfire 32 has control of the Interface FIFO. The protocol each processor uses to request and get control of the FIFO is the same. From the standpoint of the Sharc the protocol is as follows:

Unless the Sharc has or is requesting control of the FIFO, it should maintain its Flag 10 bit high. The arbitration circuit has two active low request inputs: one from the Sharc and one from the Coldfire. If both are '1'. The state of the arbitration does not change. For example, if the Sharc just had control of the FIFO, and then sets its Flag 10 bit to '1,' the state of the arbitration circuit remains the same (Sharc CVownBus bit stays high) so long as the Coldfire request bus control bit stays high. If, however, the Coldfire request bit is low when the Flag 10 bit is high, the arbitration circuit will grant control of the FIFO to the Coldfire and the Sharc's CVownBus Bit will go to '0'. At this point the Sharc cannot get control of the FIFO until the Coldfire sets it's request bit to '1'. Even if the Sharc request control by writing its Flag 10 bit low, the arbitration circuit will not allow it access until the Coldfire releases the FIFO by setting its request bit to '1'.

In summary, the rules for Sharc gaining control of the FIFO are as follows:

Request FIFO control by setting Flag 10 to '0',

Check the CVownsBus bus bit to see if it's '1',

If the CvownsBus bit is still '0', the Coldfire owns the FIFO and the Sharc has to wait for access If the CvownsBus bit is '1', then the Sharc is guaranteed full read/write control of the FIFO no matter what the Coldfire does with its request line, When the Sharc is finished with the FIFO, set the Flag 10 bit to '1' to allow the Coldfire access to the FIFO.

The important things to remember about this procedure are to always verify that the Sharc has control of the bus by checking the CVownBus bit before reading or writing the FIFO. Requesting control of the FIFO does not necessarily mean that the arbitration circuit will grant control. Also, make sure that the Flag 10 request bit is set back to '1' when finished in order to allow the Coldfire to control the FIFO when necessary.

The above procedure describes how each processor gets control of the FIFO but doesn't describe how either of them knows whether there is valid data in the FIFO. An IfceFIFOempty bit is provided for this purpose. If this bit is '1' there is no data in the FIFO and the Sharc can assume that the Coldfire has no data to transmit. If the bit is '0' however, there is data in the FIFO that requires attention.

CPU Memory

The Shark 30 has direct access to a Flash memory (e.g., Atmel AT49LV002N12TI) 28, its own SDRAM memory (e.g., Hyundai HY57V161610D) 24, 26 and indirect access to several other memory blocks through the ATCI. Below is a table of external memory addresses available to the Sharc:

TABLE 3

External Memory Map

| Description | Bus Width (bits) | Address Range |
|---|---|---|
| SDRAM | 32 | 0x0020000–0x03FFFFF |
| ATCI Chip | 16 | 0x1000000–0x100000B |

TABLE 3-continued

External Memory Map

| Flash | 8 | 0x3000000–0x303FFFF |
|---|---|---|

CPU Flash
256Kx8, byte addressable
Chip select: MS3
Address range: 0x3000000–0x303FFFF
Read / Write CPU Flash 256K×8, byte addressable Chip select: MS3

Address range: 0x000000–0x303FFFF

Read/Write

The operational code is stored in a 256K*8 field programmable flash memory 28. The TCV is set up to download this code at power up and any time there is a hard reset. The format of this code must conform to the rules in the Sharc documentation.

It's possible that a sector of this flash can be used for non-volatile data storage if necessary.

The flash is field programmable and can be accessed through Sharc memory select pin MS3.

CPU SDRAM

1M*32, long word addressable

Chip select: MS0

Address range: 0x0020000–0x3FFFFF

Read/Write

The Sharc has direct access to 4 Mbytes of SDRAM. This memory is available for both program and data storage.

Acquisition DRAM

2M*16, word addressable through the ATCI Chip

Read only

Acquired data is accessible through the Acquire Memory Register in the ATCI Chip. The address of the data to be accessed must first be loaded into the Acquire Memory Pointer.

The ATCI uses absolute values to determine trigger points so that either positive and negative values will cause a trigger, and therefore converts the incoming data to an absolute value used in the calculation.

The flash memory 28 is a non-volatile memory used to store the Sharc 30 operational program. Each time the Sharc is either powered up or reset, the program is transferred from the flash to the Sharc SDRAM 24, 26 or the Sharc 30 internal memory and executed.

The SDRAM (Synchronous Dynamic Random Access Memory) 24, 26 is attached directly to the Sharc. Both data and programs are stored in this memory to be acted upon by the Sharc.

Further details of the operation of the TCV may be found in the above-mentioned U.S. patent application Ser. No. 09/824,414, filed Apr. 2, 2001, entitled "Impulsive Transient Detection and Data Acquisition Coprocessor" which is incorporated herein by reference.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. An on-board self test system for an electrical power monitoring device, said self test system comprising:
   a test signal circuit in an electronic circuit of said monitoring device, and responsive to a stored programmable test signal for producing an analog signal simulating an electrical power waveform; and
   programmable memory in an electronic circuit of said monitoring device and operatively coupled with said test signal circuit for storing and reproducing upon command, one or more of said stored programmable test signals.

2. The system of claim 1 wherein said test signal circuit comprises a digital to analog converter and wherein said programmable memory comprises a digital electronic memory.

3. The system of claim 1 wherein said programmable memory stores one or more programmable calibration signals and wherein said test signal circuit is responsive to said one or more programmable calibration signals for producing signals for calibrating said monitoring device.

4. The system of claim 3 wherein said test signal circuit comprises a digital to analog converter and wherein said programmable memory comprises a digital electronic memory.

5. The system of claim 1 wherein said test signal circuit is switchable into and out of circuit with an input of said monitoring device.

6. The system of claim 2 wherein said digital to analog converter is tri-statable.

7. The system of claim 2 wherein said programmable memory is part of a digital signal processor component of said monitoring device.

8. The system of claim 2 wherein said programmable memory is a part of said monitoring device and is responsive to control signals from a digital signal processor of said monitoring device for reproducing and delivering to said test signal circuit one or more of said stored programmable signals.

9. The system of claim 4 wherein said digital to analog converter is tri-stable.

10. The system of claim 4 wherein said programmable memory is part of a digital signal processor component of said monitoring device.

11. A self test method for an electrical power monitoring device, said method comprising:
    generating an analog signal simulating an electrical power waveform in an electronic circuit of said monitoring device based on a stored programmable test signal; and
    storing and reproducing upon command in an electronic circuit of said monitoring device one or more of said stored programmable test signals.

12. The method of claim 11 wherein said generating a test signal comprises generating an analog test signal and wherein said storing comprises storing said programmable test signals in a digital electronic memory.

13. The method of claim 11 wherein said storing further includes storing one or more programmable calibration signals and wherein said generating includes producing signals for calibrating said monitoring device test signal circuit based on said one or more programmable calibration signals.

14. The method of claim 13 wherein said generating comprises a digital to analog conversion and wherein said storing comprises storing in a digital electronic memory.

15. The method of claim 11 including switching said test signal into and out of circuit with an input of said monitoring device.

16. The method of claim 14 wherein said digital to analog conversion is tri-statable.

17. The method of claim 12 including reproducing and delivering to a test signal generating circuit one or more of said programmable signals responsive to control signals from a digital signal processor.

18. A self test system for an electrical power monitoring device, said system comprising:
    means for generating an analog signal simulating an electrical power waveform in an electronic circuit of said monitoring device based on a stored programmable test signal; and
    means for storing and reproducing upon command in an electronic circuit of said monitoring device one or more of said stored programmable test signals.

19. The system of claim 18 wherein said means for generating comprises a digital to analog converter and wherein said means for storing comprises a programmable memory.

20. The system of claim 18 wherein said means for storing stores one or more stored programmable calibration signals and wherein said means for generating is responsive to said one or more stored programmable calibration signals for producing signals for calibrating said monitoring device.

21. The system of claim 20 wherein said means for generating comprises a digital to analog converter and wherein said means for storing comprises a programmable memory.

22. The system of claim 18 wherein said means for generating is switchable into and out of circuit with an input of said monitoring device.

23. The system of claim 19 wherein said digital to analog converter is tri-statable.

24. The system of claim 19 wherein said programmable memory is part of a digital signal processor component of said monitoring device.

25. The system of claim 19 wherein said programmable memory is a part of said monitoring device and is responsive to control signals from a digital signal processor of said monitoring device for reproducing and delivering to said test signal circuit one or more of said stored programmable signals.

26. The system of claim 21 wherein said digital to analog converter is tri-statable.

27. The system of claim 21 wherein said programmable memory is part of a digital signal processor component of said monitoring device.

* * * * *